(12) United States Patent
Park et al.

(10) Patent No.: US 7,843,072 B1
(45) Date of Patent: Nov. 30, 2010

(54) SEMICONDUCTOR PACKAGE HAVING THROUGH HOLES

(75) Inventors: Sung Su Park, Seoul (KR); Jin Young Kim, Kwangju (KR); Jeong Gi Jin, Jeju-do (KR)

(73) Assignee: Amkor Technology, Inc., Chandler, AZ (US)

( * ) Notice: Subject to any disclaimer, the term of this patent is extended or adjusted under 35 U.S.C. 154(b) by 109 days.

(21) Appl. No.: 12/190,039

(22) Filed: Aug. 12, 2008

(51) Int. Cl.
*H01L 23/48* (2006.01)

(52) U.S. Cl. .............................. 257/774; 257/E21.585

(58) Field of Classification Search ................ 257/620, 257/686, 738, 774, E21.585
See application file for complete search history.

(56) References Cited

U.S. PATENT DOCUMENTS

| | | | |
|---|---|---|---|
| 4,394,712 A | 7/1983 | Anthony | 361/411 |
| 4,499,655 A | 2/1985 | Anthony | 29/576 |
| 5,229,647 A * | 7/1993 | Gnadinger | 257/785 |
| 6,168,969 B1 | 1/2001 | Farnworth | 438/106 |
| 6,379,982 B1 | 4/2002 | Ahn et al. | 438/14 |
| 6,429,509 B1 | 8/2002 | Hsuan | 257/690 |
| 6,448,661 B1 | 9/2002 | Kim et al. | 257/777 |
| 6,573,461 B2 | 6/2003 | Roeters et al. | 174/262 |
| 6,577,013 B1 | 6/2003 | Glenn et al. | 257/777 |
| 6,608,371 B2 | 8/2003 | Kurashima et al. | |
| 6,780,770 B2 | 8/2004 | Larson | 438/689 |
| 6,853,572 B1 | 2/2005 | Sabharwal | 365/63 |
| 6,873,054 B2 * | 3/2005 | Miyazawa et al. | 257/774 |
| 7,151,009 B2 | 12/2006 | Kim et al. | |
| 7,208,838 B2 * | 4/2007 | Masuda | 257/774 |
| 7,223,634 B2 * | 5/2007 | Yamaguchi | 438/108 |
| 2002/0017710 A1 * | 2/2002 | Kurashima et al. | 257/686 |
| 2004/0192033 A1 * | 9/2004 | Hara | 438/667 |
| 2004/0251554 A1 * | 12/2004 | Masuda | 257/773 |
| 2005/0046002 A1 * | 3/2005 | Lee et al. | 257/678 |
| 2005/0104181 A1 | 5/2005 | Lee et al. | |
| 2007/0007639 A1 * | 1/2007 | Fukazawa | 257/686 |

OTHER PUBLICATIONS

Yoo et al., "Semiconductor Devices and Fabrication Methods Thereof", U.S. Appl. No. 12/270,690, filed Nov. 13, 2008.

* cited by examiner

*Primary Examiner*—Nathan W Ha
(74) *Attorney, Agent, or Firm*—Gunnison, McKay & Hodgson, L.L.P.; Serge J. Hodgson

(57) ABSTRACT

Disclosed is a semiconductor package. The semiconductor package is configured to form a plurality of through holes for forming a through silicon via at once using a sawing device used for wafer sawing instead of a separate laser drilling equipment or a deep reactive ion etching (DRIE) equipment. Accordingly, the semiconductor package saves fabricating time and increases fabrication yield, saves costs for a laser drilling equipment or a DRIE equipment, and prevents various defects generated in an inner portion of a through hole in the case of using the laser drilling equipment or the DRIE equipment.

20 Claims, 18 Drawing Sheets

SEMICONDUCTOR PACKAGE HAVING THROUGH HOLES

BACKGROUND OF THE INVENTION

1. Field of the Invention

The invention relates to a semiconductor package and a fabricating method thereof.

2. Description of the Related Art

Recently, portable electronic devices such as a mobile phone, a PMP and others have been required to achieve high-functionality, miniaturization, light-weight and price reduction. According to the tendency, a semiconductor package mounted in portable electronic devices has been also developed in a type of a 3D semiconductor package to be more innovative and price-competitive. The 3D-semiconductor package has been used by a semiconductor stacking technology using a through silicon via (TSV). The semiconductor stacking technology using the TSV is a technology indicating that semiconductor dies or semiconductor packages are perpendicularly stacked. The semiconductor stacking technology leads to reduction of the length between the semiconductor die and the semiconductor package, and thus achieves high-functionality and miniaturization of semiconductor packages.

Now, the semiconductor package provided with the through silicon via is fabricated in a thin wafer level. The through silicon via is formed by filling through holes formed on a wafer with conductive materials. The through holes are formed by using a laser drilling method or a deep reactive ion etching (DRIE) method.

However, the laser drilling method performs laser drilling in proportion to the number of through holes and leads to long time for fabrication and high cost. Additionally, the laser drilling method also leads to formation of a through hole in an inaccurate position, because it is difficult for the laser drilling method to accurately form the through hole in a desired position. Side wall bowing, silicon debris or the like are caused by the laser drilling method when a through hole is formed on a wafer, resulting in generating defects of the through silicon via formed in an inner portion of the through hole afterwards. Accordingly, the laser drilling method results in the reduction of yield of semiconductor packages.

Further, a deep reactive ion etching (DRIE) method leads to slope angle indicating that a side wall of the through hole is sloped, side wall roughness indicating that the side wall becomes rough and step coverage indicating that the side wall of the through hole is stepped, resulting in generating defects of the through silicon via formed on the through hole afterwards. Accordingly, the DRIE method also results in the reduction of yield of semiconductor packages.

The present invention will be more apparent from the following detailed description taken in conjunction with the accompanying drawings.

SUMMARY OF THE INVENTION

Disclosed is a semiconductor package. The semiconductor package is configured to form a plurality of through holes for forming a through silicon via at once using a sawing device used for wafer sawing instead of a separate laser drilling equipment or a deep reactive ion etching (DRIE) equipment. Accordingly, the semiconductor package saves fabricating time and increases fabrication yield, saves costs for a laser drilling equipment or a DRIE equipment, and prevents various defects generated in an inner portion of a through hole in the case of using the laser drilling equipment or the DRIE equipment.

BRIEF DESCRIPTION OF THE DRAWINGS

Common reference numerals are used throughout the drawings and the detailed description to indicate the same elements.

DETAILED DESCRIPTION OF THE INVENTION

Figure 1:
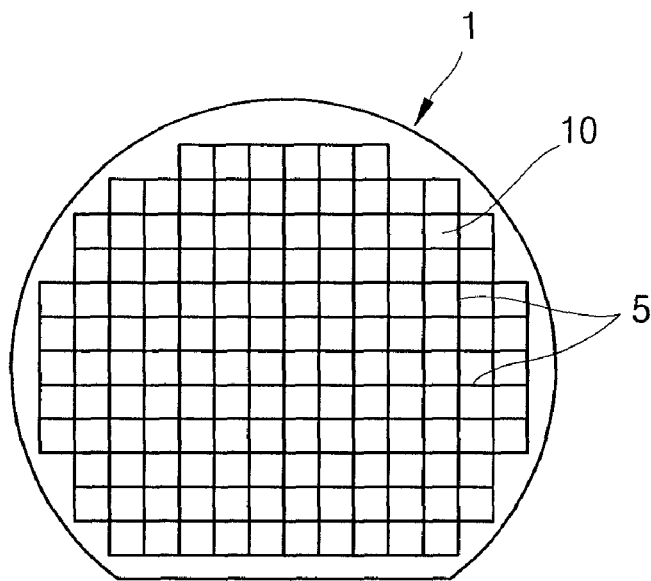
FIG. 1 is a schematic plan view illustrating a wafer on which a semiconductor package is formed according to an embodiment of the present invention.

Referring to FIG. 1, a wafer on which a semiconductor package is formed according to an embodiment of the present invention is shown as a schematic plan view.

As shown in FIG. 1, a plurality of semiconductor packages 10 are formed on a wafer 1 made of a silicon material. The semiconductor packages 10 independently separated by a sawing process according to a scribing line 5 of the wafer 1 are used for various electric and electronic fields. The semiconductor packages 10 can be fabricated in a wafer level state. Hereinafter, the structure and fabricating method of one semiconductor package 10 of the semiconductor packages 10 in the wafer level state will be explained.

Figure 2A:
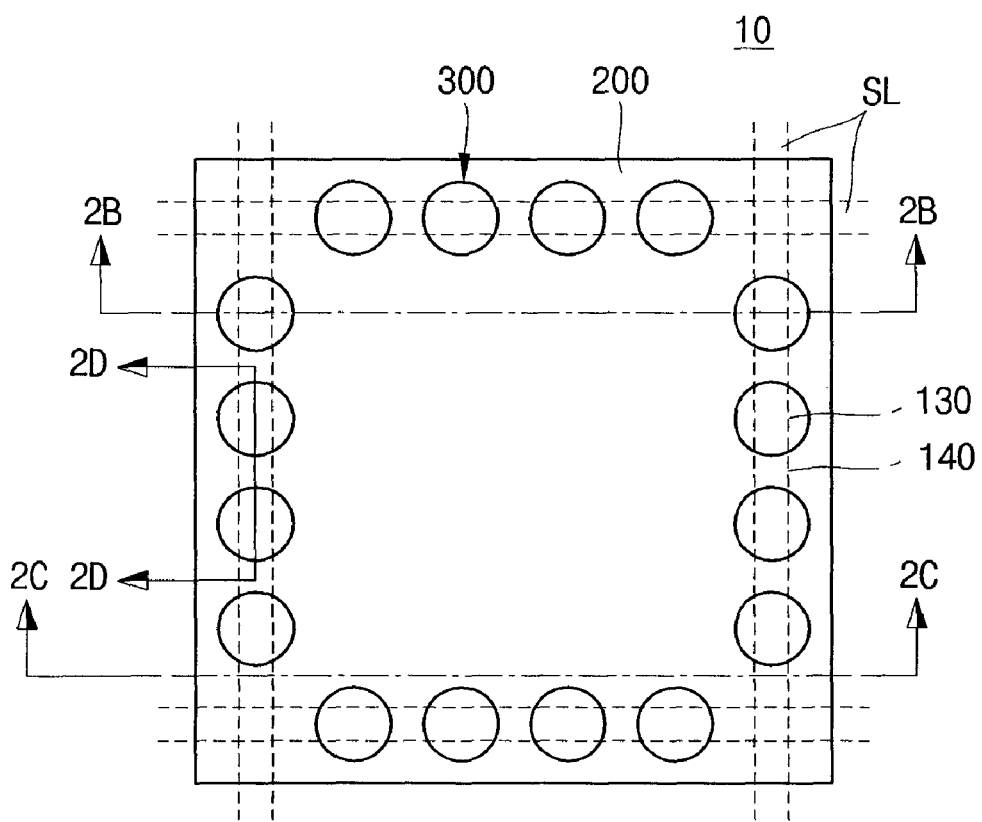
FIG. 2A is a plan view illustrating the semiconductor package of FIG. 1.
Figure 2B:
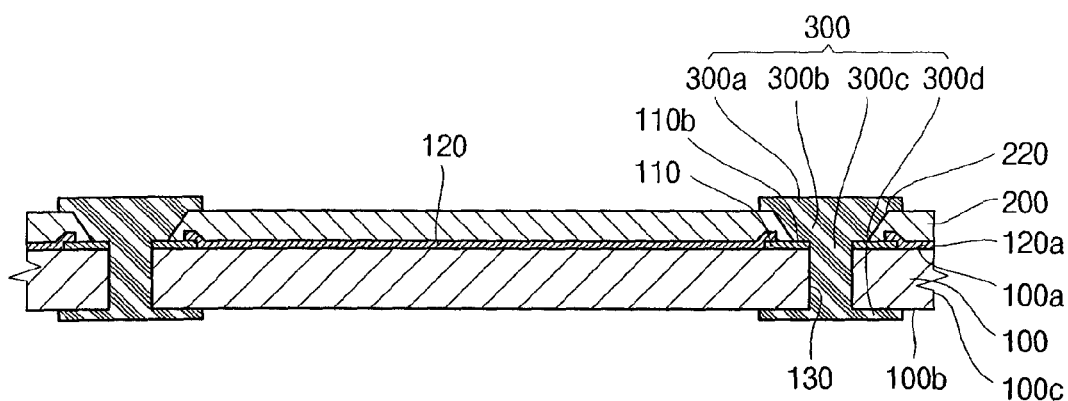
FIG. 2B is a cross-sectional view taken along a 2B-2B line of FIG. 2A.

Referring to FIG. 2A, the semiconductor package 10 of FIG. 1 is shown as a plan view. Referring to FIG. 2B, a cross-sectional view is shown, taken along a 2B-2B line of FIG. 2. Referring to 2C, a cross-sectional view is shown, taken along a 2C-2C line of FIG. 2A. Referring to 2D, an enlarged cross-sectional view is shown, taken along a 2D-2D line of FIG. 2A. Referring to FIG. 2E, a bottom surface view of a semiconductor die is shown, prior to formation of a fourth electrode.

Referring to FIGS. 2A to 2E, a semiconductor package 10 according to the embodiment of the present invention includes a semiconductor die 100 and a photosensitive layer pattern 200 and a through silicon via 300.

Referring to FIG. 2B, the semiconductor die 100 may include an approximately planar first surface 100*a* and a second surface 100*b* in opposite to the first surface 100*a*. Further, the semiconductor die 100 includes a third surface 100*c* connecting the first surface 100*a* with the second surface 100*b* and approximately perpendicular to the first and second surfaces 100*a* and 100*b*.

The semiconductor die 100 includes a plurality of bond pads 110 formed on the first surface 100*a*. The bond pads 110 are arranged in a line along an approximately periphery of the first surface 100*a*.

The semiconductor die 100 includes a passivation layer 120 formed on the first surface 100*a*. The passivation layer 120 is formed to cover the first surface 100*a* of the semiconductor die 100 and expose the bond pads 110. The passivation layer 120 includes a lateral surface 120*a* formed approximately on the same plane surface as the third surface 100*c* of the semiconductor die 100. The passivation layer 120 covers the first surface 100*a* of the semiconductor die 100. As a result thereof, the first surface 100*a* of the semiconductor die 100 on which an active area (not shown) is formed can be protected. The passivation layer 120 may be made of any one material selected from an oxide film, a nitride film and a polyimide or equivalent materials, but not limited thereto. The passivation layer 120 may be formed by patterning or etching a portion of the bond pads 110 to be exposed after deposition to the first surface 100*a* of the semiconductor die 100.

Figure 2C:
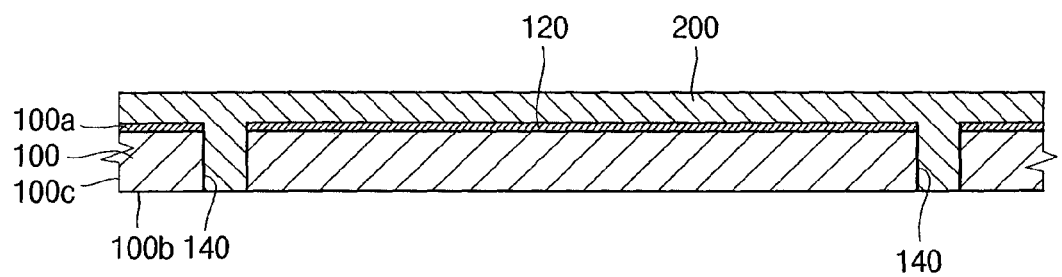
FIG. 2C is a cross-sectional view taken along a 2C-2C line of FIG. 2A.
Figure 2D:
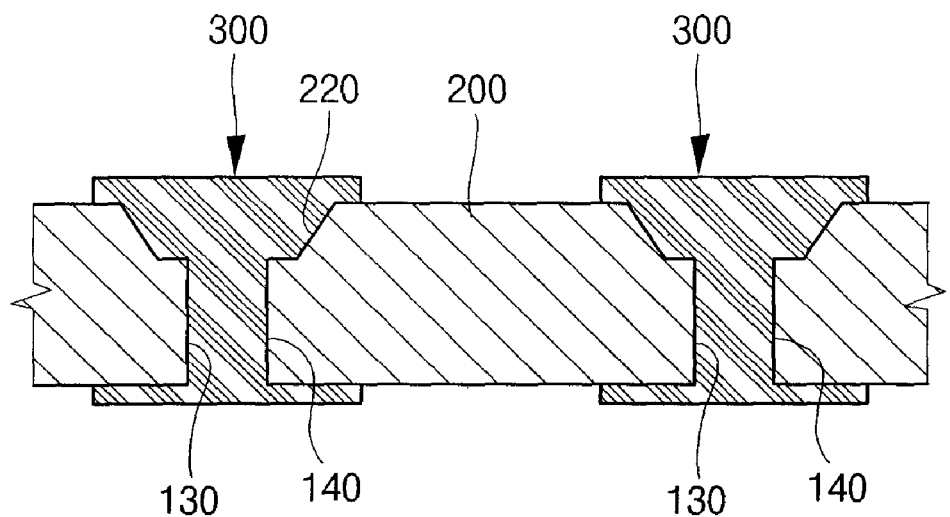
FIG. 2D is an enlarged cross-sectional view taken along a 2D-2D line of FIG. 2A.
Figure 2E:
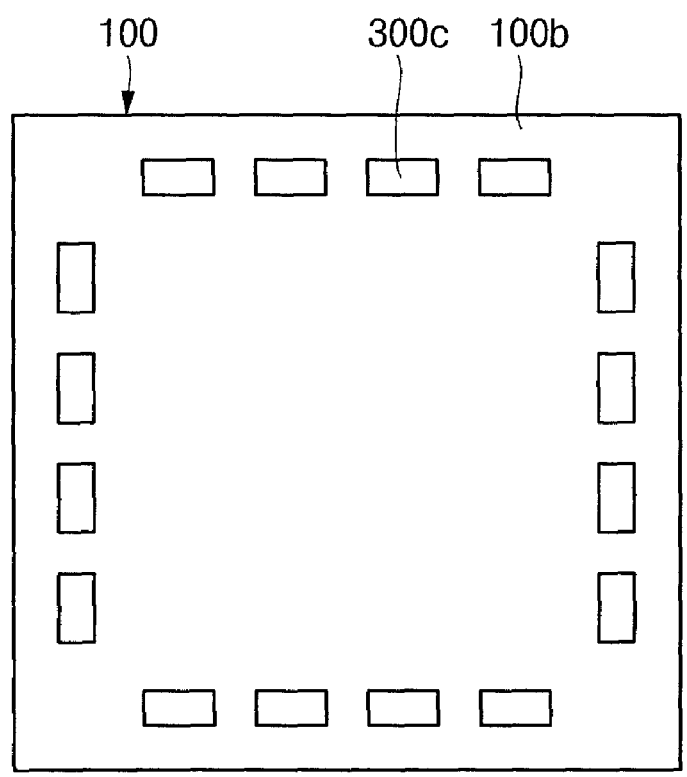
FIG. 2E is a bottom view of a semiconductor die prior to formation of a fourth electrode.

Referring to FIGS. 2B to 2D, the semiconductor die 100 further includes a first through hole 130 perpendicularly penetrating the bond pads 110 and the first surface 100*a* of the semiconductor die 100. The semiconductor die 100 further includes a second through hole 140 penetrating the passivation layer 120 and the first surface 100*a* of the semiconductor die 100 between adjacent bond pads 110 of the bond pads 110. The first through hole 130 and the second through hole 140 are provided in a trench shape connected to each other. This is the reason that the first through hole 130 and the second through hole 140, as shown in FIG. 2A, are formed by sawing the semiconductor die 100 at a predetermined depth in a direction from the first surface 100*a* to the second surface 100*b* along a straight sawing line (SL) formed to pass through respectively the bond pads 110. More particularly, the first through holes 130 and second through holes 140 are portions of trenches formed in the first surface 100*a* of the semiconductor die 100 by sawing along the sawing lines (SL). Accordingly, first through holes 130 and second through holes 140 are sometimes called first trench portions and second trench portions, respectively.

The sawing for forming the first and second through holes 130 and 140 may be formed using any one sawing device selected from blade, laser and bevel. The sawing device is advantageous to enable the first through hole 130 to have a wider width (for example, 2 mil) and a deeper depth (for example, 50 μm) in comparison with a laser drilling device. A through silicon via 300, formed on the first through hole 130 having the width and the depth, to be explained below has a larger diameter and a longer length. As a result thereof, there can be increased a high aspect ratio of a semiconductor package defined by a ratio of the diameter and the length of the through silicon via 300. Further, the sawing device may be used for the sawing of the wafer 1. As a result thereof, there can be saved fabricating cost of the semiconductor package, in comparison with the use of a high-priced laser drilling equipment or a deep reactive ion etching (DRIE) equipment for forming through holes, alternatively a sawing device used for conventional sawing of a wafer. When the blade or the bevel is used as the sawing device, it is preferable for the blade or the bevel to have the width narrower than that of the bond pads 110.

Meanwhile, the sawing using the sawing device is performed to pass through a plurality of bond pads 110 and thus an active area between adjacent bond pads 110 is not formed. In other words, the active area is formed in a central portion on the first surface 100*a* of the semiconductor 100. As a result thereof, the damage to active area can be prevented by sawing the semiconductor die 100 at a predetermined depth in a direction from the first surface 100*a* to the second surface 100*b*.

As described above, the first through hole 130 on which the through silicon via 300 to be explained below is formed by using the sawing device. Accordingly, a plurality of first through holes 130 can be formed at once. As a result thereof, there can saved time for forming a plurality of first through holes 130, saved whole time for fabricating a semiconductor package and increased fabrication yield of the semiconductor package.

The photosensitive layer pattern 200 formed on an upper portion of the passivation layer 120 and an inner portion of the second through hole 140 includes a pattern hole 220 exposing the first through hole 130 and a portion 110*b* of the bond pads 110 connecting with the first through hole 130. The photosensitive layer pattern 200 reinforces the strength of the semiconductor die 100 having resistance to external force weakened by forming the first and second through holes 130 and 140. As a result thereof, the damage to the semiconductor package 100 can be prevented in a semiconductor package fabricating process. Further, as shown in FIG. 2D, the photosensitive layer pattern 200 is formed on the second through hole 140 positioned close between the adjacent first through holes 130, so as to mutually electrically insulate the adjacent through silicon vias 300 when the through silicon vias 300 are formed on the first through hole 130. The photosensitive layer pattern 200 is formed by coating a photosensitive material on the first surface 100*a* of the semiconductor die 100, particularly an upper portion of the passivation layer 120 with any one method selected from spin coating, spray coating, radius coating, printing and laminating, and by patterning the photosensitive material through a photo process.

The through silicon via 300 can be formed by extending inside the first through hole 130 from the photosensitive layer pattern 200 via the pattern hole 220. The through silicon via 300 is used as electrical connection wiring when other semiconductor packages or a plurality of semiconductor dies are stacked on the semiconductor package 10. As a result thereof, there can be formed a thin and high-functionality semiconductor package. According to the embodiment of the present invention, the through silicon via 300, sometimes called the through silicon hole 300, is protruded on a surface of the photosensitive layer pattern 200. However, the through silicon via 300 can be formed on the same planar surface as the photosensitive layer pattern 200, and can be formed at the height lower than the surface of the photosensitive layer pattern 200.

The through silicon via 300 may concretely include a first electrode 300a, a second electrode 300b and a third electrode 300c. The through silicon via 300 may further include a fourth electrode 300d formed on the second surface 100b of the semiconductor die 100.

The first electrode 300a formed on the surface of the photosensitive layer pattern 200 enables the semiconductor package 10 to electrically couple to other semiconductor packages when the other semiconductor packages are stacked on the semiconductor package 10.

The second electrode 300b formed in an inner portion of the pattern hole 220 of the photosensitive layer pattern 200 is electrically coupled to the first electrode 300a. Further, the second electrode 300b is electrically coupled to the bond pads 110.

The third electrode 300c formed in an inner portion of the first through hole 130 is electrically coupled to the second electrode 300b. Further, the third electrode 300c is electrically coupled to the bond pads 110. The third electrode 300c, as shown in FIG. 2E, may have a rectangular planar shape. This is the reason that the sawing for forming the first through hole 130 in which the third electrode 300c is formed is performed along a straight sawing line (SL) formed to pass through the bond pads 110 respectively. As such, the third electrode 300c has a rectangular planar shape and thus the third electrode 300c may have relatively larger planer size, in comparison with a circular planar shape of the third electrode 300c, which is formed in the first through hole 130 formed by using a laser drilling method. Accordingly, when the fourth electrode 300d coupling with the third electrode 300c is formed, a size of contacting the third and fourth electrodes 300c and 300d is increased. As a result thereof, there can be improved electrical conductivity. Further, the third electrode 300c used as an align key for forming the fourth electrode 300d enables the fourth electrode 300d to be easily aligned when the fourth electrode 300d is formed on the third electrode 300c, which has larger size of the rectangular planar shape, rather than that of a circular planar shape.

The first, second and third electrodes 300a, 300b and 300c are integrally formed. Further, The first, second and third electrodes 300a, 300b and 300c are formed by filling the first through hole 130 with a conductive material using any one method selected from physical vapor deposition, chemical vapor deposition, electroplating and electroless plating. The conductive material may be formed by any one material selected from copper (Cu), gold (Au), silver (Ag) and aluminum (Al) or equivalent materials, but not limited thereto.

The fourth electrode 300d is formed on the second surface 100b of the semiconductor die 100 to be electrically coupled to the third electrode 300c, and thus the fourth electrode 300d enables the semiconductor package 10 to be electrically coupled to other semiconductor packages when the semiconductor package 10 is stacked on the other semiconductor packages. The fourth electrode 300d may be formed by depositing a conductive material on the second surface 100b of the semiconductor die 100 using sputtering or plating. The conductive material may be the one used to form the first, second and third electrodes 300a, 300b and 300c.

The semiconductor package 10 according to the embodiment of the present invention is configured to form the first through hole 130 and the second through hole 140, using a sawing device such as blade or bevel used for sawing the wafer 1 instead of a laser drilling equipment or a DRIE equipment. As a result thereof, there can be saved costs for the laser drilling equipment or the DRIE equipment and reduced various defects such as side wall bowing and step coverage generated in an inner portion of a through hole by means of the laser drilling equipment of the DRIE equipment.

Further, the semiconductor package 10 according to the embodiment of the present invention is configured to form the first through hole 130, the second through hole 140, specifically a plurality of first through holes in which the through silicon via 300 is formed at once using the sawing device. As a result thereof, there can be saved fabricating time for semiconductor packages and increased fabrication yield of the semiconductor package, rather than a case using the laser drilling equipment or the DRIE equipment.

Further, the semiconductor package 10 according to the embodiment of the present invention is configured to form a first through hole 130 having a wider width and a deeper depth using the sawing device and a through silicon via 300 in the first through hole 130. As a result thereof, there can be increased a high aspect ratio of the semiconductor package defined by a ratio of a diameter and a length of the through silicon via 300.

Further, the semiconductor package 10 according to the embodiment of the present invention is configured to form a photosensitive layer pattern 200 on a semiconductor die 100 to reinforce the strength of the semiconductor die 100 weakened by the first through hole 130 and the second through hole 140. As a result thereof, there can be improved resistance of the semiconductor die 100 to external force. Particularly, the semiconductor package 10 according to the embodiment of the present invention is configured to form a photosensitive layer pattern 200 on the second through hole 140 positioned between the first through holes 130 adjacent to the photosensitive layer pattern 200 to electrically insulate adjacent through silicon vias 300 formed in the adjacent first through holes 130. As a result thereof, electric short of the adjacent through silicon vias 300 can be prevented.

Figure 3:
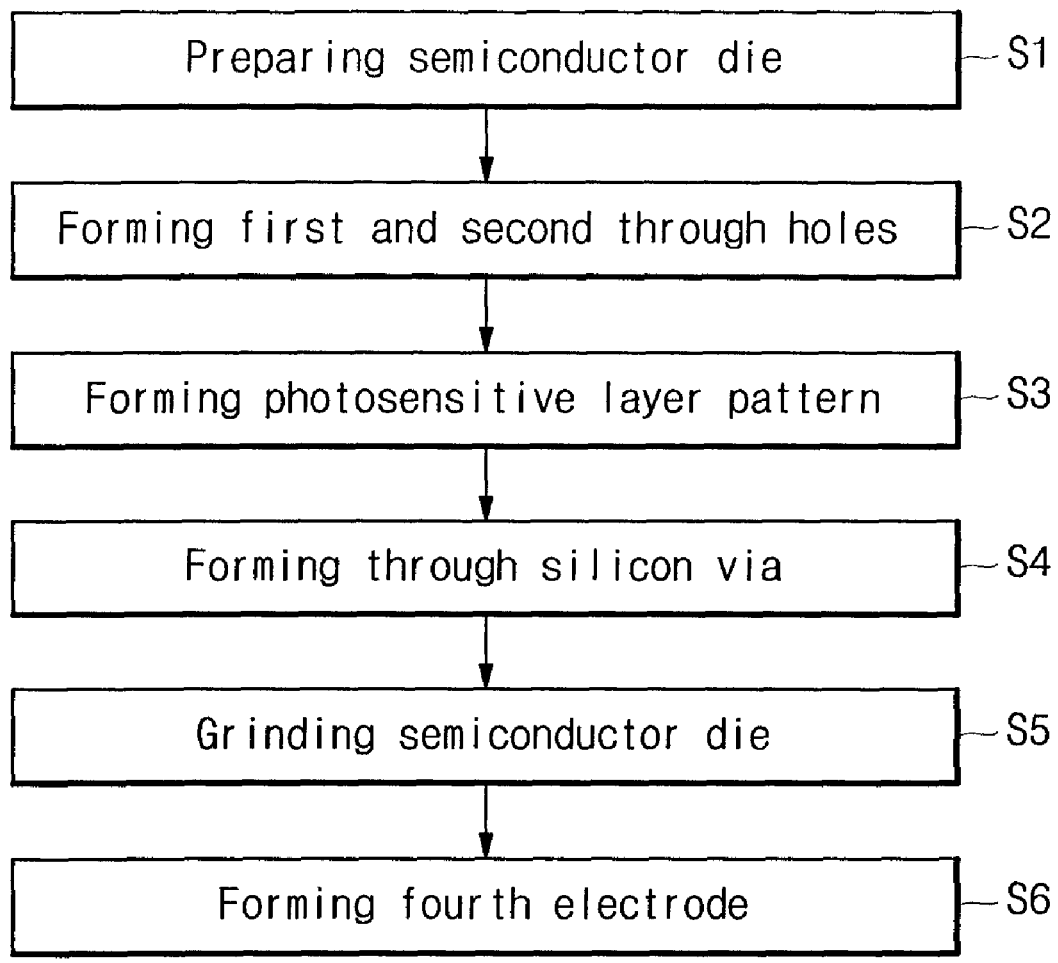
FIG. 3 is a flow chart illustrating a semiconductor package fabricating method according to an embodiment of the present invention.

Referring to FIG. 3, a fabricating method of a semiconductor package according to an embodiment of the present invention is shown as a flow chart.

Referring to FIG. 3, the fabricating method of the semiconductor package according to the embodiment of the present invention includes a preparing semiconductor die operation (S1), a forming first and second through holes operation (S2), a forming photosensitive layer pattern operation (S3), a forming through silicon via operation (S4), a grinding semiconductor die operation (S5) and a forming fourth electrode operation (S6).

Figure 4A:
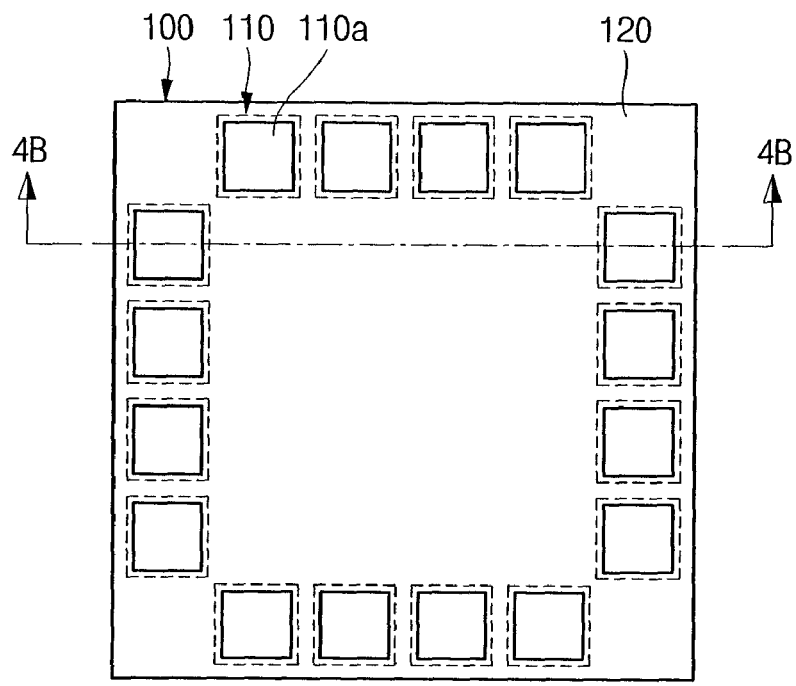
FIGS. 4A and 4B are a plan view and a cross-sectional view of a semiconductor package explaining an operation of preparing a semiconductor die of FIG. 3.
Figure 4B:
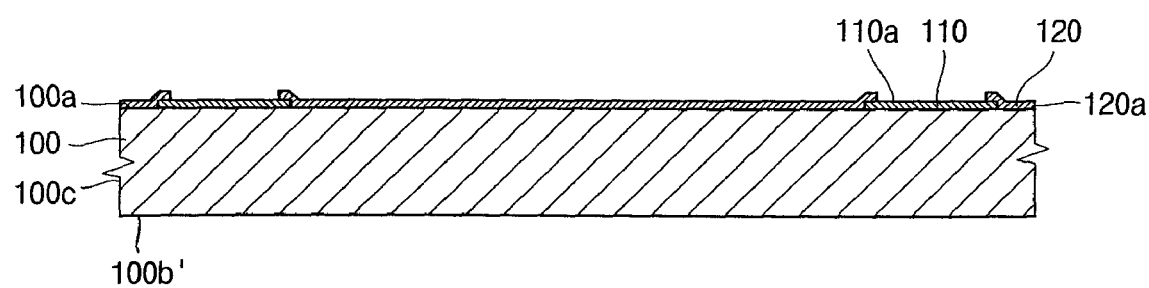

Referring to FIGS. 4A and 4B, the preparing semiconductor die operation (S1) is shown as a plan view and a cross-sectional view.

Referring to FIGS. 4A and 4B, the preparing semiconductor die operation (S1) includes preparing the semiconductor die 100 provided with a planar first surface 100a, a planar second surface 100b' in opposite to the first surface 100a, a plurality of bond pads 110 formed on the first surface 100a and a passivation layer 120 exposing a plurality of bond pads 110.

The semiconductor die 100 may include a third surface 100c connecting the first surface 100a with the second surface 100b' and approximately perpendicular to the first surface 100a and the second surface 100b'. The bond pads 110 have rectangular planar shapes. The bond pads 110 may be arranged in a line along a periphery of the first surface 100a of the semiconductor die 100. The passivation layer 120 is formed by covering the first surface 100a of the semiconductor die 100 and exposing a portion 110a of the bond pads 110. The passivation layer 120 includes a lateral surface 120a approximately formed in the same planar shape as the third surface 100c of the semiconductor die 100. The passivation layer 120 covers the first surface 100a of the semiconductor die 100. As a result thereof, the first surface 100a of the semiconductor die 100 on which an active area (not shown) is formed can be protected. The passivation layer 120 may be made of any one material selected from an oxide film, a nitride film and a polyimide or equivalent materials, but not limited thereto. The passivation layer 120 may be formed by patterning or etching a portion of the bond pads 110 to be exposed after deposition to the first surface 100a of the semiconductor die 100.

Figure 5A:
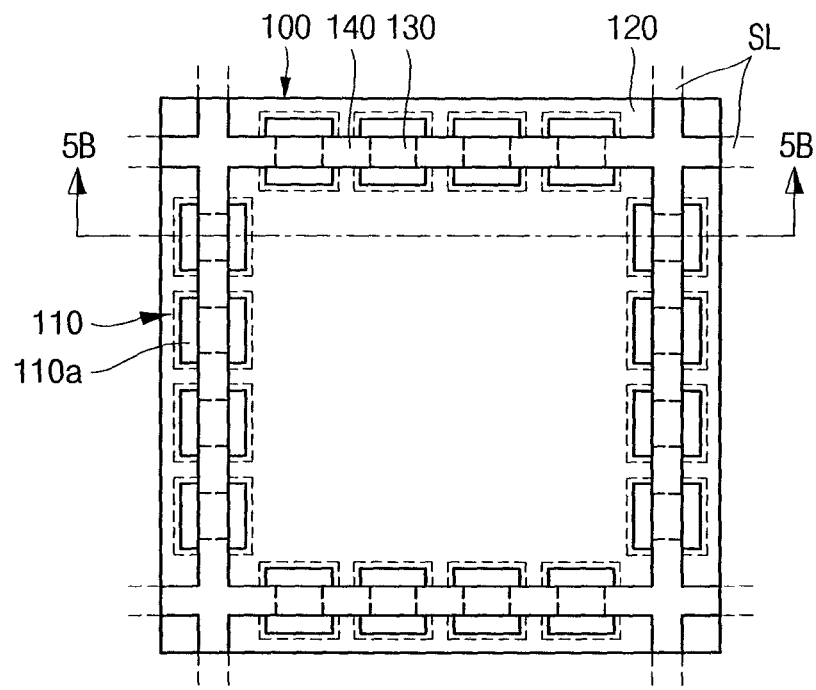
FIGS. 5A and 5B are a plan view and a cross-sectional view of a semiconductor die explaining an operation of forming first and second through holes of FIG. 3.
Figure 5B:
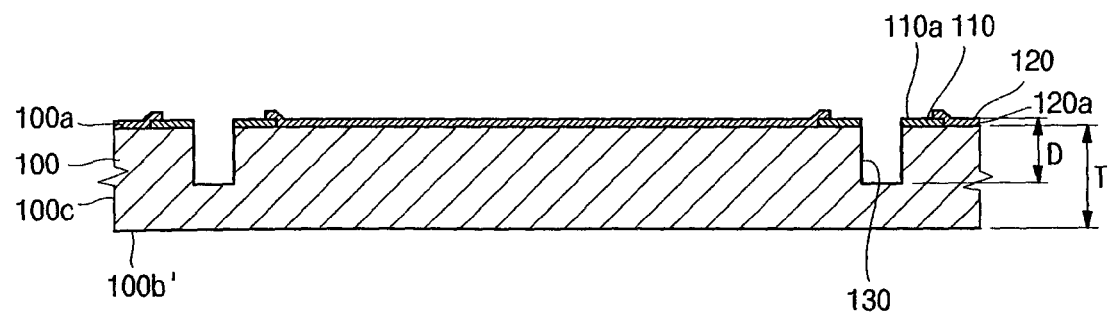

Referring to FIGS. 5A and 5B, the forming first and second through holes operation (S2) of FIG. 3 is shown as a plan view and a cross-sectional view of a semiconductor die.

Referring to FIGS. 5A and 5B, the forming first and second through holes operation (S2) performs sawing of the semiconductor die 100 along a sawing line (SL) formed to respectively pass through the bond pads 110 at a predetermined depth in a direction from the first surface 100a to the second surface 100b', to form the first and second through holes 130 and 140.

The sawing for forming the first and second through holes 130 and 140 may be formed by using any one sawing device selected from blade, laser and bevel. The sawing device is advantageous to enable the first through hole 130 to have a wider width (for example, 2 mil) and a deeper depth (for example, sop) in comparison with a laser drilling device. A through silicon via 300 formed in the first through hole 130 having the width and the depth to be described below may have a larger diameter and a longer length. As a result thereof, there can be increased a high aspect ratio of a semiconductor package defined by a ratio of the diameter and the length of the through silicon via 300. Further, the sawing device may be used for the sawing of the wafer 1. As a result thereof, there can be saved fabricating costs of the semiconductor package, in comparison with a case of using a laser drilling equipment or a DRIE equipment used for forming a through hole, separately from the sawing device used for the conventional sawing of a wafer. When the sawing device is used as blade or bevel, it is preferable for the blade or the bevel to have a width narrower than that of the bond pads 110.

The depth (D) of the first through hole 130 formed by the sawing of the semiconductor die 100 may be ⅓ or ⅔ of the thickness (T) of the semiconductor die 100. When the depth (D) of the first through hole 130 is less than ⅓ of the thickness (T) of the semiconductor die 100, the second surface 100b' of the semiconductor die 100 is mostly grinded so as to expose a third electrode 300c of a through silicon via 300 formed in the first through hole 130 and thus the semiconductor die 100 becomes excessively thinner. As a result thereof, there can be spatially limited in forming elements on the semiconductor die 100. Further, the depth (D) of the first through hole 130 is more than ⅔ of the thickness (T) of the semiconductor die 100, the semiconductor can be damaged in a fabricating process of a semiconductor package because of resistance to external force of the semiconductor excessively weakened.

Meanwhile, the sawing using the sawing device is formed to pass through the bond pads 110, and thus an active area is not formed between the adjacent bond pads 110. In other words, the active area is formed in a central portion on the first surface 100a of the semiconductor die 100. As a result thereof, the damage of the active area generated by sawing the semiconductor die 100 at a predetermined depth in a direction from the first surface 100a to the second surface 100b' of the semiconductor die 100 can be prevented.

As such, the forming first and second through holes operation (S2) can form the first through hole 130 and the second through hole 140 using the sawing device, specifically, a plurality of first through holes 130 in which the through silicon via 300 is formed, at once. As a result thereof, there can be saved fabricating time for semiconductor packages and increased fabrication yield of the semiconductor packages.

Referring to FIGS. 6A-6B and 7A-7C, the forming photosensitive layer pattern operation (S3) of FIG. 3 is shown as a plan view and a cross-sectional view of a semiconductor die.

Figure 6A:
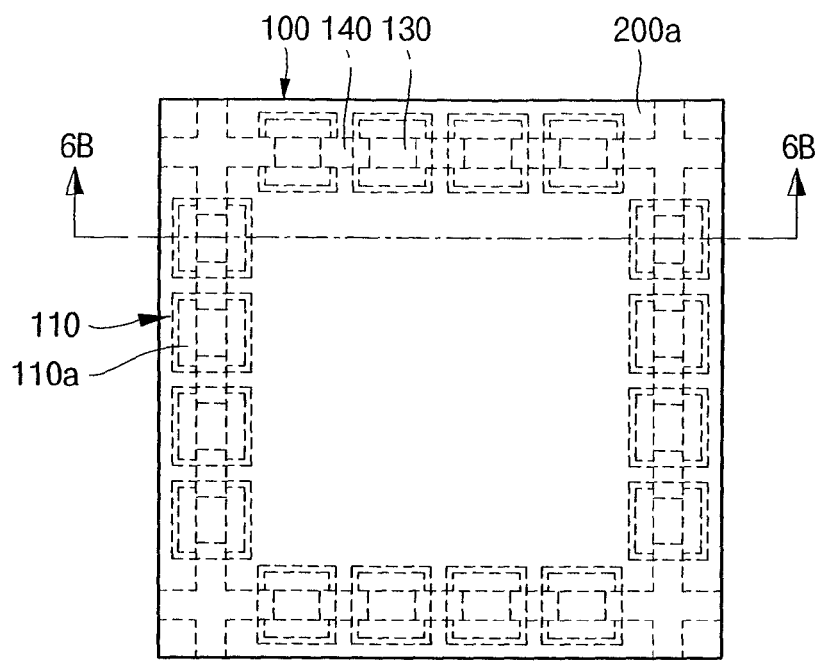
FIGS. 6A-6B and 7A-7C are plan views and cross-sectional views of a semiconductor die explaining an operation of forming a photosensitive layer pattern of FIG. 3.
Figure 6B:
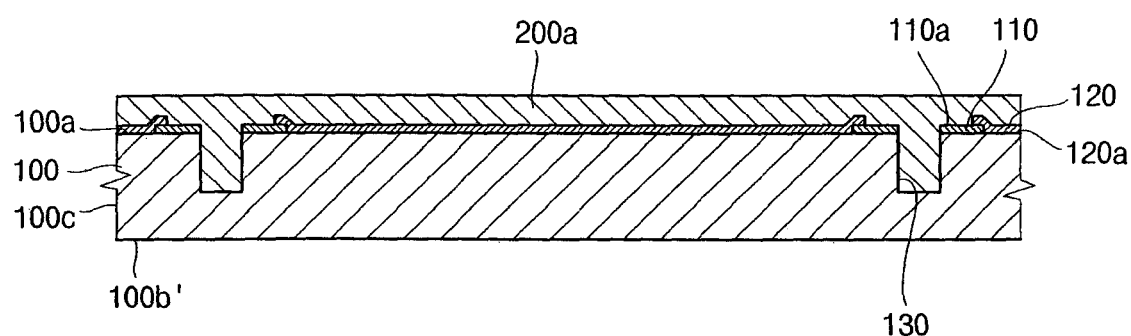
Figure 7A:
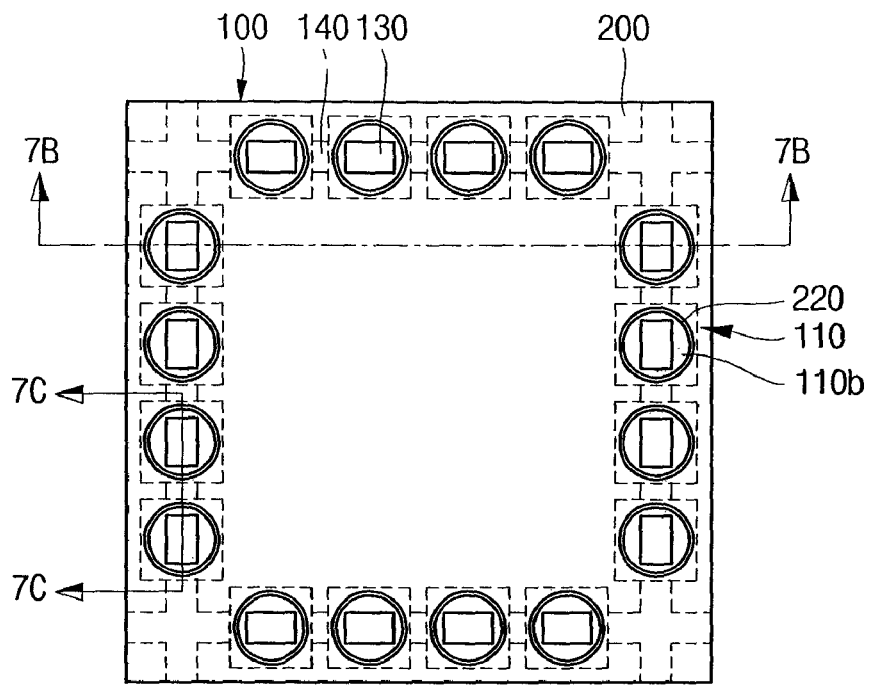
Figure 7B:
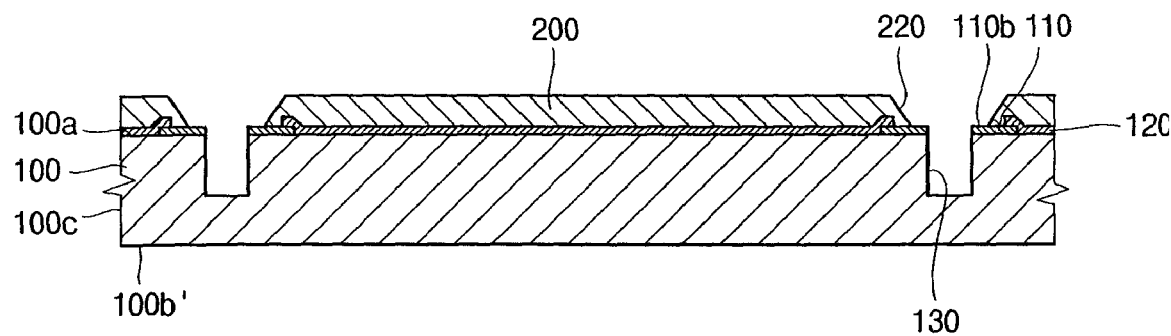
Figure 7C:
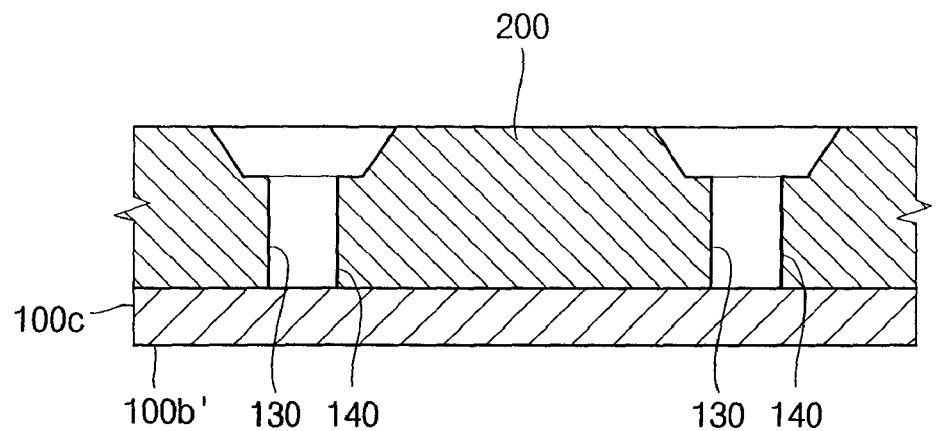

The forming photosensitive layer pattern operation (S3) includes forming a photosensitive layer 200a on the whole first surface 100a of the semiconductor die 100 provided with the first through hole 130 and the second through hole 140, as shown in FIGS. 6A and 6B, and forming a photosensitive layer pattern 200 by patterning the photosensitive layer 200a so as to expose the first through hole 130 and a portion 110b of the bond pads 110 connecting with the first through hole 130, as shown in FIGS. 7A and 7B.

Concretely, the photosensitive layer 200a is formed by coating a photosensitive material with any one method selected from spin coating, spray coating, radius coating, printing and laminating on the whole first surface 100a of the semiconductor die 100 provided with the first through hole 130 and the second through hole 140.

The photosensitive layer pattern 200 is formed by patterning the photosensitive layer 200a through a photo process including exposure, developing and curing so as to expose the first through hole 130 and the portion 110b of the bond pads 110. Accordingly, the photosensitive layer pattern 200 is concretely formed on an upper portion of the passivation 120 and an inner portion of the second through hole 140, and includes a pattern hole 220 exposing the first through hole 130 and the portion 110b of the bond pads 110 connected with the first through hole 130. The photosensitive layer pattern 200 reinforces the strength of the semiconductor die 100 having resistance to external force weakened by forming the first and second through holes 130 and 140. As a result thereof, the damage of the semiconductor die 100 generated in the fabricating process of the semiconductor package can be prevented. Further, the photosensitive layer pattern 200 is formed on the second through hole 140 positioned between the adjacent first through holes 130, so as to mutually electrically insulate the adjacent through silicon vias 300 when the through silicon via 300 is formed in the first through hole 130.

Figure 8A:
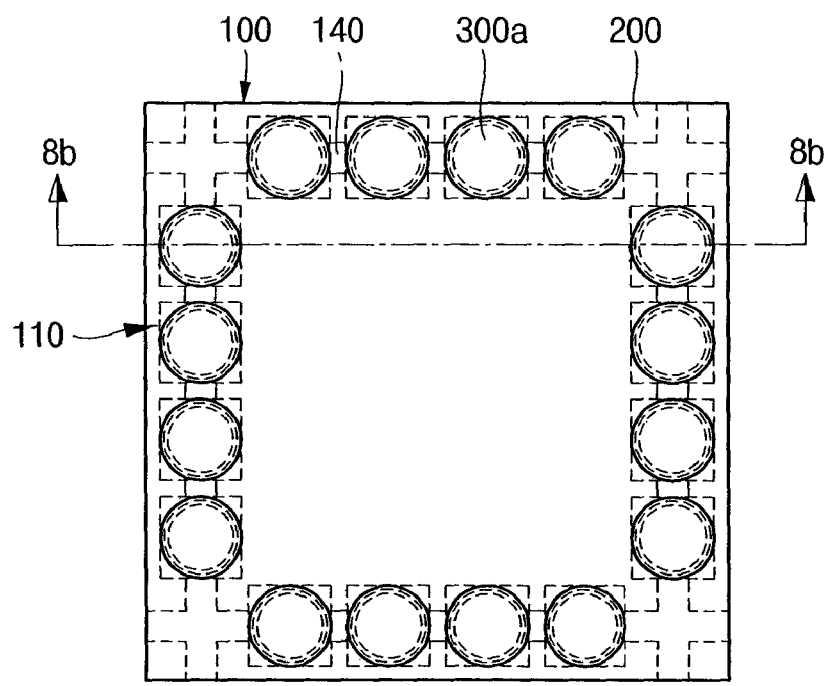
FIGS. 8A and 8B are a plan view and a cross-sectional view explaining an operation of forming a through silicon via of FIG. 3.
Figure 8B:
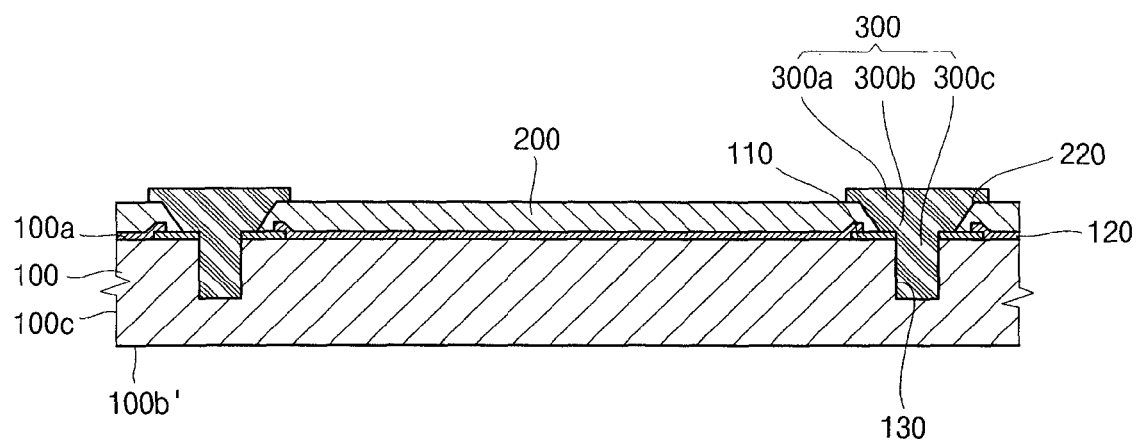

Referring to FIGS. 8A and 8B, the forming through silicon via operation (S4) of FIG. 3 is shown as a plan view and a cross-sectional view of a semiconductor die.

Referring to FIGS. 8A and 8B, the forming through silicon via operation (S4) fills the first through hole 130 with a conductive material to form a through silicon via 300.

The conductive material is filled by using any one method selected from physical vapor deposition, chemical vapor deposition, electroplating and electroless plating. The through silicon via 300 may be formed by extending inside the first through hole 130 from the photosensitive layer pattern 200 via the pattern hole 220. The through silicon via 300 serves as electric coupling wiring when other semiconductor packages are stacked to the semiconductor package 10 or a plurality of semiconductor dies are stacked, and thus a thin and high-functionality semiconductor package can be formed. According to the embodiment of the present invention, the through silicon via 300 protruded on a surface of the photosensitive layer pattern 200 can be formed on the same surface as the photosensitive layer pattern 200 and can be formed at a height lower than the surface of the photosensitive layer pattern 200.

The through hole 300 may concretely include a first electrode 300a, a second electrode 300b and a third electrode 300c. When the first electrode 300a formed on the surface of the photosensitive layer pattern 200 stacks other semiconductor packages on the semiconductor package 10, the first electrode 300a electrically couples the semiconductor package 10 to other semiconductor packages. The second electrode 300b formed in an inner portion of the pattern hole 220 of the photosensitive layer pattern 200 is electrically coupled to the first electrode 300a. Further, the second electrode 300b is electrically coupled to the bond pads 110. The second electrode 300c formed in an inner portion of the first through hole 130 is electrically coupled to the second electrode 300b. Further, the third electrode 300c is electrically coupled to the bond pads 110. The planar shape of the third electrode 300c may be rectangular (see FIG. 9A). This is the reason that the sawing for forming the first through hole 130 provided with the third electrode 300c is formed along a straight sawing line (SL) formed to respectively pass through the bond pads 110. Accordingly, when a fourth electrode 300d coupled with the third electrode 300c is formed, the size contacting the third electrode 300c to the fourth electrode 300d is increased, and thus electric conductivity between the vias can be improved. Further, as the third electrode 300c serves as an align key forming the fourth electrode 300d, an align process for the fourth electrode 300d can be facilitated when the third electrode 300c having larger size of the rectangular planar shape, in comparison with the circular planar shape, is formed on the fourth electrode 300d. The first electrode 300a, the second electrode 300b and the third electrode 300c may be integrally formed.

Figure 9A:
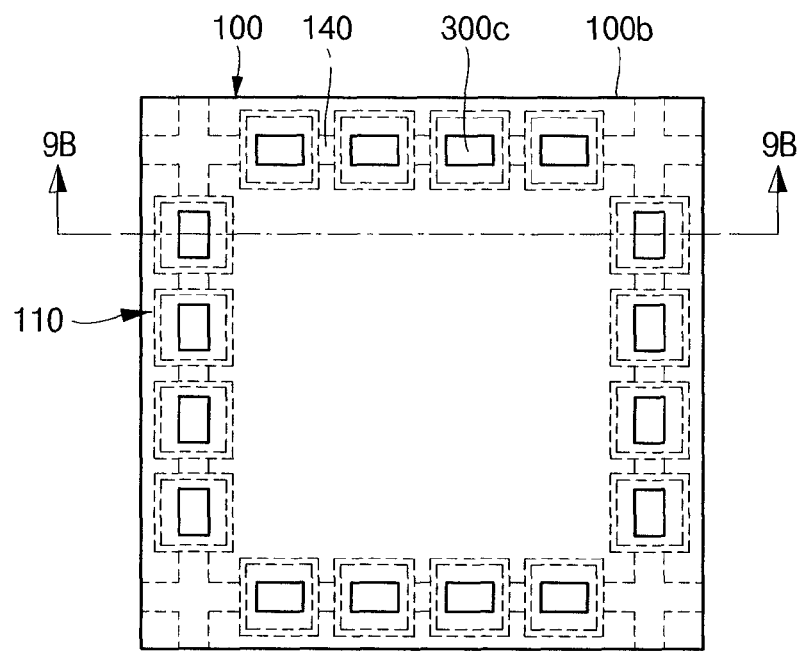
FIGS. 9A and 9B are a bottom view and a cross-sectional view explaining an operation of grinding a semiconductor die of FIG. 3.
Figure 9B:
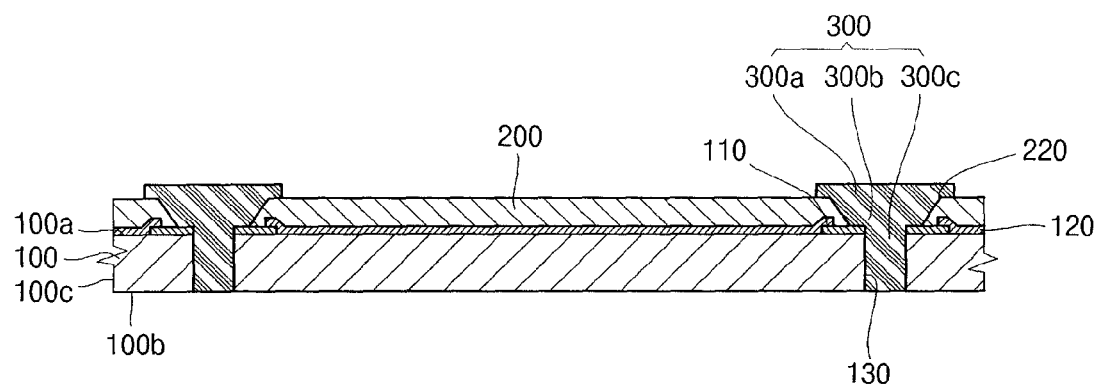

Referring to FIGS. 9A and 9B, the grinding semiconductor die operation (S5) of FIG. 3 is shown as a bottom view and a cross-sectional view of the semiconductor die.

Referring to FIGS. 9A and 9B, the grinding semiconductor die operation (S5) includes grinding the second surface 100b' of the semiconductor die 100 to expose the through silicon via 300, concretely the third electrode 300c.

The grinding of the second surface 100b' of the semiconductor die 100 may be performed by using chemical etching, mechanical etching, laser irradiating method or equivalent methods, but not limited thereto. The second surface 100b' of the semiconductor die 100 is grinded so as to form the planar second surface 100b to which the third electrode 300c is exposed.

Figure 10A:
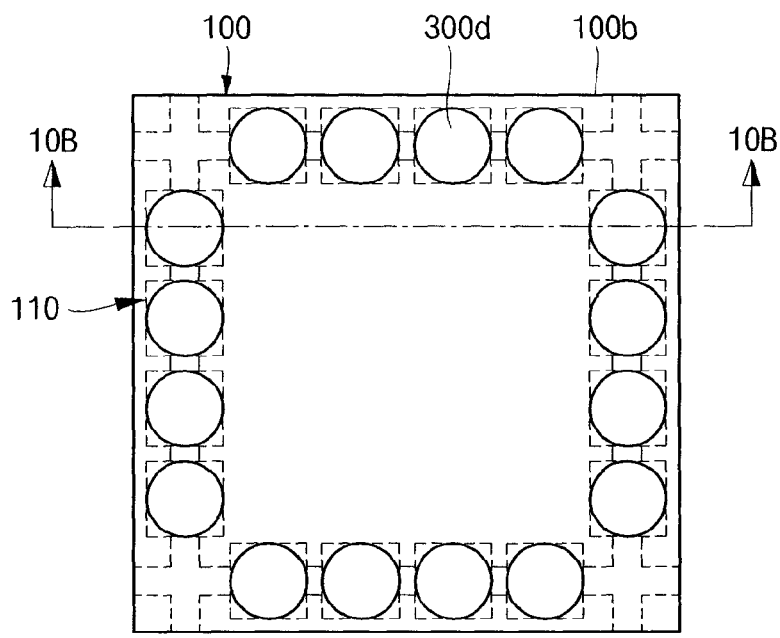
FIGS. 10A and 10B are a bottom view and a cross-sectional view explaining an operation of forming a fourth electrode of FIG. 3.
Figure 10B:
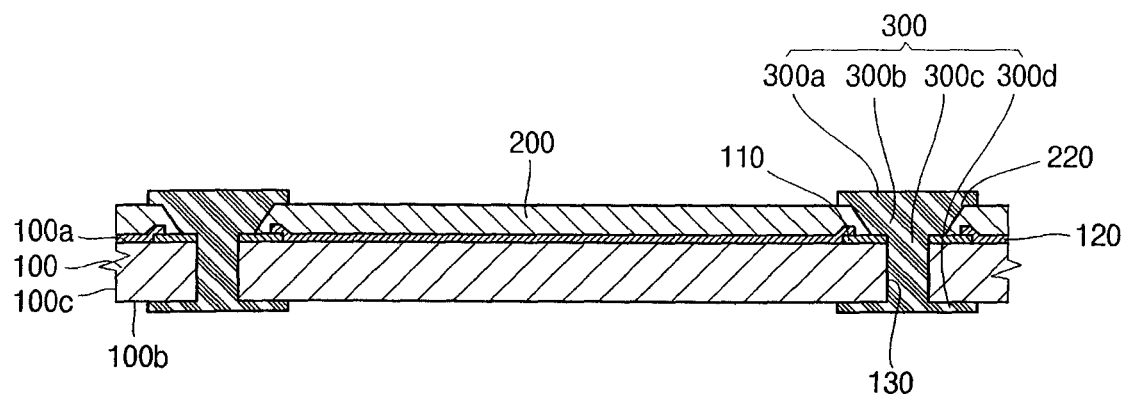

Referring to FIGS. 10A and 10B, the forming fourth electrode operation (S6) of FIG. 3 is shown as a bottom view and a cross-sectional view of a semiconductor die.

Referring to FIGS. 10A and 10B, the forming fourth electrode operation (S6) includes forming the fourth electrode 300d electrically coupled with the third electrode 300c exposed to the second surface 100b of the semiconductor die 100.

The fourth electrode 300d is formed by depositing a conductive material on the second surface 100b of the semiconductor die 100 so as to electrically couple to the third electrode 300c. The deposition of the conductive material may be performed by sputtering, plating or equivalent methods, but not limited thereto. The fourth electrode 300d enables the semiconductor package 10 to be electrically coupled to other semiconductor packages when the semiconductor package 10 is stacked to the other semiconductor packages.

As such, a fabricating method of a semiconductor package according to the embodiment of the present invention includes forming the first through hole 130 and the second through hole 140 using a sawing device such as blade or bevel used for the sawing of the wafer 1 instead of a laser drilling equipment or a DRIE equipment. As a result thereof, there can be saved cost for the laser drilling equipment or the DRIE equipment and reduced various defects such as side wall bowing and step coverage generated in an inner portion of a through hole when the through hole is formed by using the laser drilling equipment or the DRIE equipment.

Further, a fabricating method of a semiconductor package according to the embodiment of the present invention includes forming the first through hole 130 and the second through hole 140 using the sawing device, particularly a plurality of first through holes 130 in which the through silicon via 300 is formed, using the sawing device. As a result thereof, there can be saved fabricating cost of the semiconductor package and increased fabrication yield of the semiconductor package, rather than a case of using the laser drilling equipment or the DRIE equipment.

Further, the fabricating method of the semiconductor package according to the embodiment of the present invention forms the first through hole 130 having a wider width and a deeper depth using the sawing device to form the through silicon via 300 in the first through hole 130. As a result thereof, there can be increased a high aspect ratio of the semiconductor package defined by a ratio of a diameter and a length of the through silicon via 300.

Further, the fabricating method of the semiconductor package according to the embodiment of the present invention forms the photosensitive layer pattern 200 on the semiconductor die 100 to reinforce the strength of the semiconductor die 100 having a strength weakened by forming the first through hole 130 and the second through hole 140, and thus the semiconductor die 100 has high resistance to external force. More particularly, the semiconductor package 10 according to the embodiment of the present invention is configured to form the photosensitive pattern 200 in the second through hole 140 positioned between the adjacent first through holes 130 and electrically insulate the adjacent through silicon vias 300 formed on the adjacent first through holes 130. As a result thereof, electric short of the adjacent through silicon vias 300 can be prevented.

Then, the semiconductor package of another embodiment will be explained, wherein the semiconductor package according to one embodiment of the present invention is applied.

Figure 11:
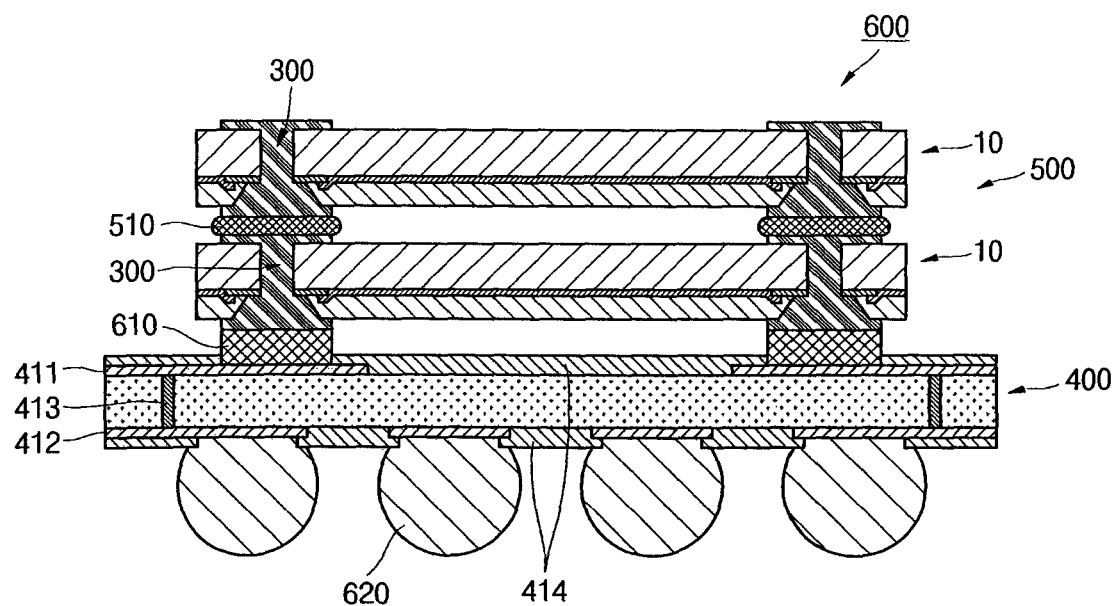
FIG. 11 is a cross-sectional view of a semiconductor package according to another embodiment of the present invention.

Referring to FIG. 11, the semiconductor package is shown as a cross-sectional view according to another embodiment of the present invention.

As shown in FIG. 11, the semiconductor package 600 according to another embodiment of the present invention includes a circuit board 400, a stacked semiconductor package 500 including a plurality of first conductive bumps 510, a plurality of second conductive bumps 610 and a plurality of solder balls 620. The semiconductor package 600 may be formed by stacking the circuit board 400 and the stacked semiconductor package 500 on each other and by coupling the circuit board 400 to the stacked semiconductor package 500 electrically by means of the second conductive bump 610. Additionally, the semiconductor package 600 may be electrically coupled to an external device by means of the solder ball 620.

The circuit board 400 may include a first circuit pattern 411 formed on an upper surface of the board 400, a second circuit pattern 412 formed on a lower surface thereof and a via hole 413 electrically coupling the first circuit pattern 411 to the second circuit pattern 412.

Additionally, the circuit board 400 may further include a solder mask 414 covering a predetermined portion of the first and second circuit patterns 411 and 412. The solder mask 414 covers the portion of the first and second circuit patterns 411 and 412. As a result thereof, oxidation or corrosion of the first and second circuit patterns 411 and 412 can be prevented, due to excessive exposure to the outside. Additionally, the solder mask 414 is formed between the second conductive bumps 610 formed on the first circuit pattern 411 and between the solder balls 620 formed on the second circuit pattern 412. As a result thereof, electric short can be prevented between the second conductive bump 610 and the solder ball 620. The solder mask 414 may be formed through a process of exposing and then developing thermosetting resin or UV-curable resin, but not limited thereto.

The stacked semiconductor package 500 is formed by stacking a plurality of semiconductor packages 10 and by coupling the packages 10 electrically to each other by means of the first conductive bump 510. Specifically, the stacked semiconductor package 500 is formed by enabling one semiconductor package 10 and the other semiconductor package 10, being arranged in side by side, to be electrically coupled to each other through the first conductive bump 510 formed between through silicon vias 300 of the semiconductor packages 10.

The semiconductor package 10 constituted in the stacked semiconductor package 500 is explained in detail in one embodiment of the present invention, thus the explanation will be omitted. Meanwhile, FIG. 11 shows the stacked semiconductor package 500 is formed by stacking two semiconductor packages 10, however, the semiconductor package 500 may be formed by stacking at least three semiconductor packages 10. Accordingly, the number of semiconductor packages 10 is not limited thereto, which are stacked in the embodiment of the present invention.

The first conductive bump 510 constituted in the stacked semiconductor package 500 is formed between the through silicon vias 300 of one and the other semiconductor packages 10. The first conductive bump 510 electrically couples a plurality of semiconductor packages 10 to each other. The first conductive bump 510 may be made of solder, gold, silver or an equivalent material, but not limited thereto.

The second conductive bump 610, formed on the first circuit pattern 411, is electrically coupled to the first circuit pattern 411. The second conductive bump 610 is electrically coupled to the through silicon via 300 of one semiconductor package 10 faced to the circuit board 400 of the stacked semiconductor package 500. Thus, the second conductive bump 610 couples the circuit board 400 to the stacked semiconductor package 500 electrically. The second conductive bump 610 may be made of the same material as that of the first conductive bump 510.

The solder ball 620, formed on the second circuit pattern 412, is electrically coupled to the second circuit pattern 412. The solder ball 620 is electrically coupled to an external device, and thus the circuit board 400 transmits/receives an electrical signal to/from the external device. The solder ball 620 may be made of Sn/Pb and Leadless Sn or an equivalent material, but not limited thereto.

As such, the semiconductor package 600 according to another embodiment of the present invention is formed by stacking the circuit board 400 and the stacked semiconductor package 500 to each other. As a result thereof, capacity and functionality of the semiconductor package can be increased due to various applications to a semiconductor package field.

Additionally, the semiconductor package 600 according to another embodiment of the present invention can reduce the mounted area, in comparison with the area mounted on an external device by separating the circuit board 400 and the stacked semiconductor package 500 respectively.

The semiconductor package of still another embodiment will be explained, wherein the semiconductor package is applied according to one embodiment of the present invention.

Figure 12:
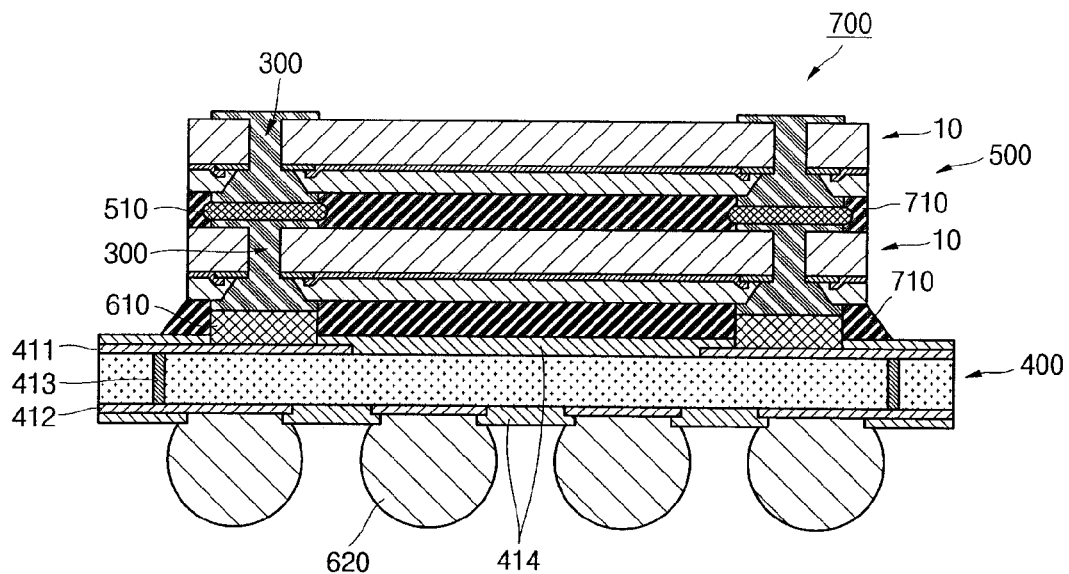
FIG. 12 is a cross-sectional view of a semiconductor package according to still another embodiment of the present invention.

Referring to FIG. 12, the semiconductor package is shown as a cross-sectional view according to still another embodiment.

As shown in FIG. 12, the semiconductor package 700 according to still another embodiment of the present invention is formed by stacking the circuit board 400 and the stacked semiconductor package 500 to each other and by coupling the circuit board 400 to the stacked semiconductor package 500 electrically by means of the second conductive bump 610. The semiconductor package 700, having the same configuration as the semiconductor package 600, is further equipped with an underfill 710 in comparison with the semiconductor package 600 shown in FIG. 11. Accordingly, the same numerals will be indicated for the same configuration and repetitive explanation will be omitted. Now, the underfill 710 will be explained in detail.

The underfill 710 may be formed between one semiconductor package 10 and the other semiconductor package 10 of the stacked semiconductor package 500. In this time, the underfill 710 may surround the first conductive bump 510. The underfill 710 maintains stable connection between the first conductive bump 510 and one semiconductor package 10, and between the first conductive bump 510 and another semiconductor package 10 thermally or mechanically.

Additionally, the underfill 710 may be formed between one semiconductor package 10 faced to the circuit board 400 of the stacked semiconductor package 500 and the circuit board 400. In this time, the underfill 710 may surround the second conductive bump 610 formed between one semiconductor package 10 and the circuit board 400. The underfill 710 maintains stable connection between the second conductive bump 610 and one semiconductor package 10, and between the second conductive bump 610 and the circuit board 400 thermally or mechanically.

The underfill 710 may be made of epoxy resin, thermosetting resin and polymer or an equivalent material, but not limited thereto.

As such, the semiconductor package 700 according to another embodiment of the present invention is equipped with the underfill 710 and formed by stacking the circuit board 400 and the stacked semiconductor package 500 to each other. As a result thereof, binding force between the stacked semiconductor package 500 and the circuit board 400 can be increased in comparison with the semiconductor package 600 shown in FIG. 11.

The semiconductor package of still another embodiment will be explained, wherein the semiconductor package is applied according to one embodiment of the present invention.

Figure 13:
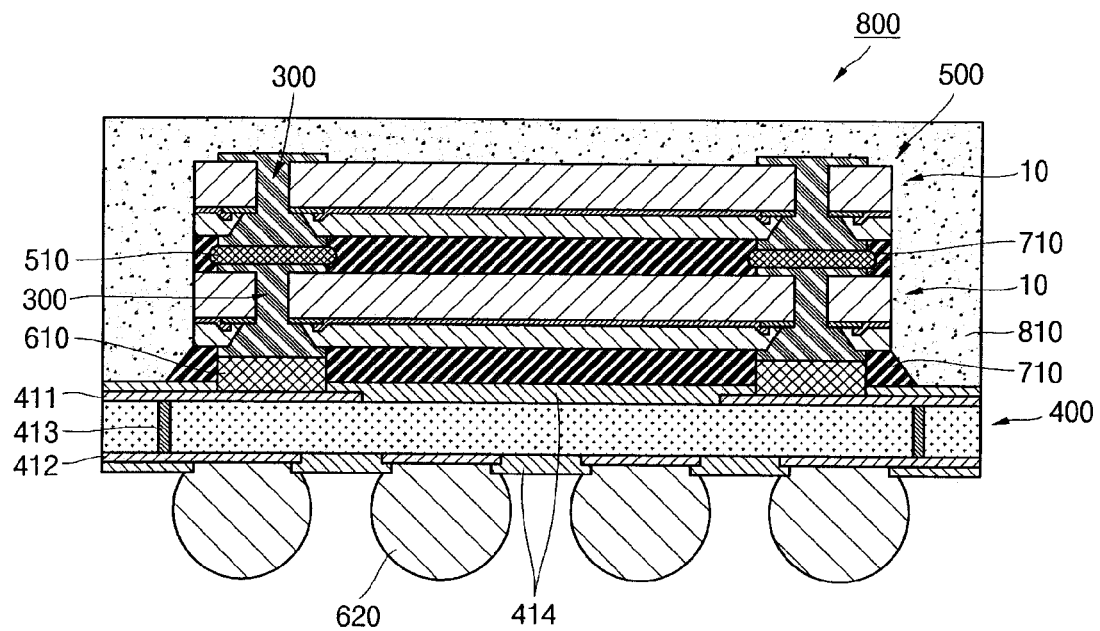
FIG. 13 is a cross-sectional view of a semiconductor package according to still another embodiment of the present invention.

Referring to FIG. 13, the semiconductor package is shown as a cross-sectional view according to still another embodiment of the present invention.

As shown in FIG. 13, the semiconductor package 800 according to still another embodiment of the present invention is formed by stacking the circuit board 400 and the stacked semiconductor package 500 to each other and by coupling the circuit board 400 to the stacked semiconductor package 500 electrically by means of the second conductive bump 610. The semiconductor package 800, having the same configuration as the semiconductor 700, is further equipped with an encapsulant 810 in comparison with the semiconductor package 700 shown in FIG. 12. Accordingly, the same numerals are indicated for the same configuration, and repetitive explanation will be omitted. Then, the encapsulant 810 will be explained in detail.

The encapsulant 810 surrounds completely the stacked semiconductor package 500 formed on the circuit board 400. In other words, the encapsulant 810 surrounds completely one semiconductor package 10 and the other semiconductor package 10 of the stacked semiconductor package 500. The encapsulant 810 protects the one semiconductor package 10 and the other semiconductor package 10 from the outside. As a result thereof, binding force between the circuit board 400 and the stacked semiconductor package 500 can be increased.

As such, the semiconductor package 800 according to another embodiment of the present invention is equipped with the encapsulant 810 and formed by stacking the circuit board 400 and the stacked semiconductor package 500 to each other. As a result thereof, binding force between the stacked semiconductor package 500 and the circuit board 400 can be increased and the stacked semiconductor package 500 can be protected from the outside simultaneously, in comparison with the semiconductor package 700 shown in FIG. 12.

The semiconductor package of still another embodiment will be explained, wherein the semiconductor package is applied according to one embodiment of the present invention.

Figure 14:
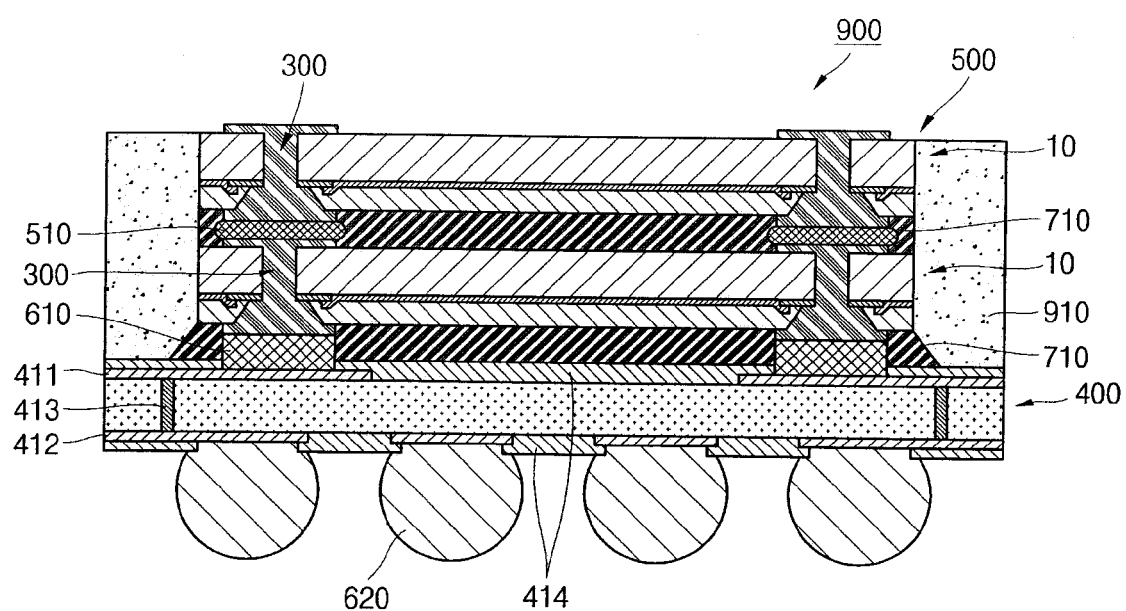
FIG. 14 is a cross-sectional view of a semiconductor package according to still another embodiment of the present invention.

Referring to FIG. 14, the semiconductor package is shown as a cross-sectional view according to another embodiment of the present invention.

As shown in FIG. 14, the semiconductor package 900 according to still another embodiment of the present invention is formed by stacking the circuit board 400 and the stacked semiconductor package 500 to each other and electrically coupling the circuit board 400 to the stacked semiconductor package 500 by means of the second conductive bump 610. The semiconductor package 900, having the same configuration as the semiconductor package 800, is formed by enabling the encapsulant 910 to expose a portion of the semiconductor package 10, in comparison with the semiconductor package 800 shown in FIG. 13. Accordingly, the same numerals are indicated for the same configuration and repetitive explanation is omitted. Then, the encapsulant 910 will be explained in detail.

The encapsulant 910, surrounding one semiconductor package 10 and the other semiconductor package 10 of the stacked semiconductor package 500, exposes one surface of the other semiconductor package 10 being outermost from the circuit board 400 in a vertical direction. The encapsulant 910 protects one semiconductor package 10 and the other semiconductor package 10 from the outside and increases binding force between the circuit board 400 and the stacked semiconductor package 500. Additionally, the encapsulant 910 exposes one surface of the other semiconductor package 10. As a result thereof, thermal performance of the semiconductor package 900 can be increased.

As such, the semiconductor package 900, equipped with the encapsulant 910 exposing a portion of the stacked semiconductor package 500, is formed by stacking the circuit board 400 and the stacked semiconductor package 500 to each other. As a result thereof, thermal performance can be increased in comparison with the semiconductor package 800.

The semiconductor package of still another embodiment will be explained, wherein the semiconductor package is applied according to one embodiment of the present invention.

Figure 15:
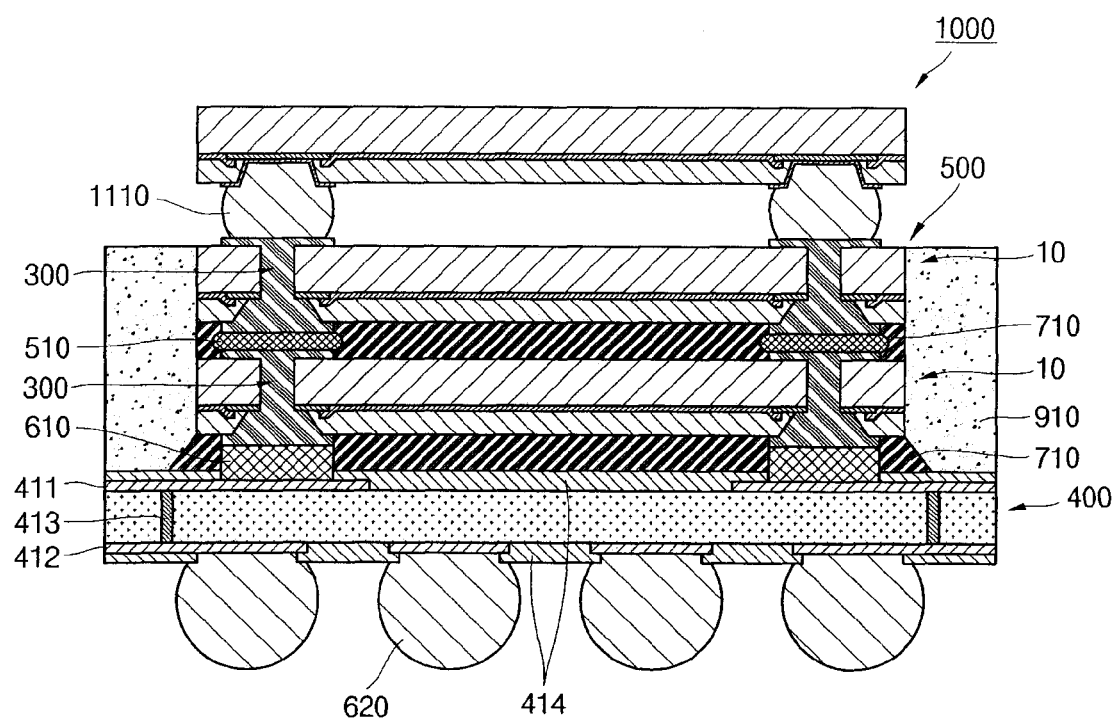
FIG. 15 is a cross-sectional view of a semiconductor package according to still another embodiment of the present invention.

Referring to FIG. 15, the semiconductor package is shown as a cross-sectional view according to still another embodiment of the present invention.

As shown in FIG. 15, the semiconductor package 1100 according to still another embodiment of the present invention is formed by stacking the semiconductor die 1000 on the circuit board 400 and the stacked semiconductor package 500, and by coupling the semiconductor die to the circuit board 400 and the stacked semiconductor package 500 electrically through a third conductive bump 1110. The semiconductor package, having the same configuration as the semiconductor package 900, is further equipped with the semiconductor die 1000 in comparison with the semiconductor package 900 shown in FIG. 14. Accordingly, the same numerals are indicated for the same configuration and repetitive explanation is omitted. Now, the semiconductor die 1000 will be explained in detail.

The semiconductor die 1000 is electrically coupled to the through silicon via 300 exposed to an upper portion of the stacked semiconductor package 500 through the third conductive bump 1110. As a result thereof, the semiconductor die 1000 can be electrically coupled to the stacked semiconductor package 500 and the circuit board 400.

As such, the semiconductor package 1100 is formed by stacking not only the circuit board 400 and the stacked semiconductor package 500 stacked to each other but the semiconductor die 1000. As a result thereof, capacity and functionality of the semiconductor package can be increased, in comparison with the semiconductor packages 600, 700, 800 and 900 shown in FIGS. 11 to 14.

A fabricating method of the semiconductor package will be explained, wherein the semiconductor package is shown in FIG. 15.

Figure 16:
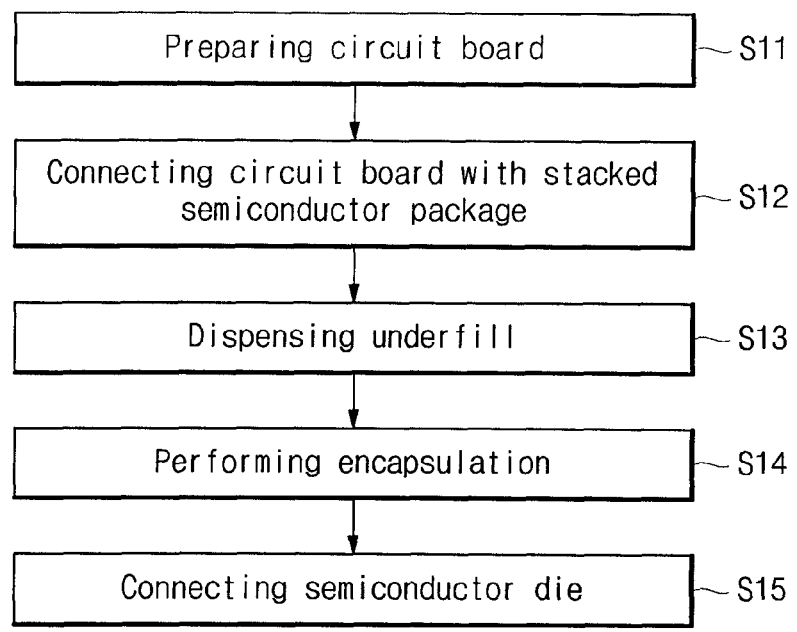
FIG. 16 is a flow chart illustrating a fabricating method of the semiconductor package of FIG. 15.

Referring to FIG. 16, the fabricating method of the semiconductor package of FIG. 15 is shown as a flow chart.

As shown in FIG. 16, the fabricating method of the semiconductor package includes a preparing circuit board operation (S11), a connecting circuit board with stacked semiconductor package operation (S12), a dispensing underfill operation (S13), a performing encapsulation operation (S14) and a connecting semiconductor die operation (S15).

Referring to FIGS. 17A to 17E, the fabricating method of the semiconductor package of FIG. 16 is explained as cross-sectional views of the semiconductor packages.

Figure 17A:
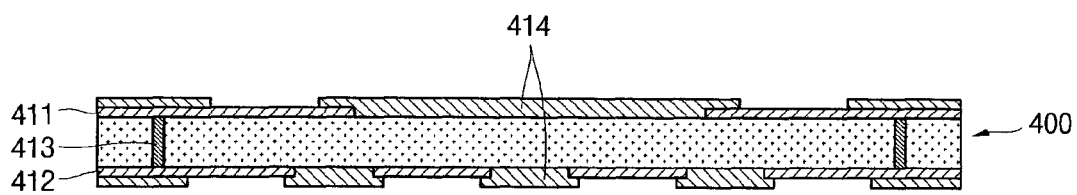
FIGS. 17A to 17E are cross-sectional views of the semiconductor package for explaining the fabricating method of the semiconductor package of FIG. 16.

Referring to FIG. 17A, the preparing circuit board operation (S11) includes preparing the circuit board 400, which includes a first circuit pattern 411 formed on an upper surface of the circuit board, a second circuit pattern 412 formed on a lower surface thereof, a via hole 413 coupling the first and second circuit patterns 411, 412 electrically to each other and a solder mask 414 covering a predetermined portion of the first and second circuit patterns 411, 412.

The circuit board 400 is explained in detail in FIG. 11, and thus it will be omitted.

Figure 17B:
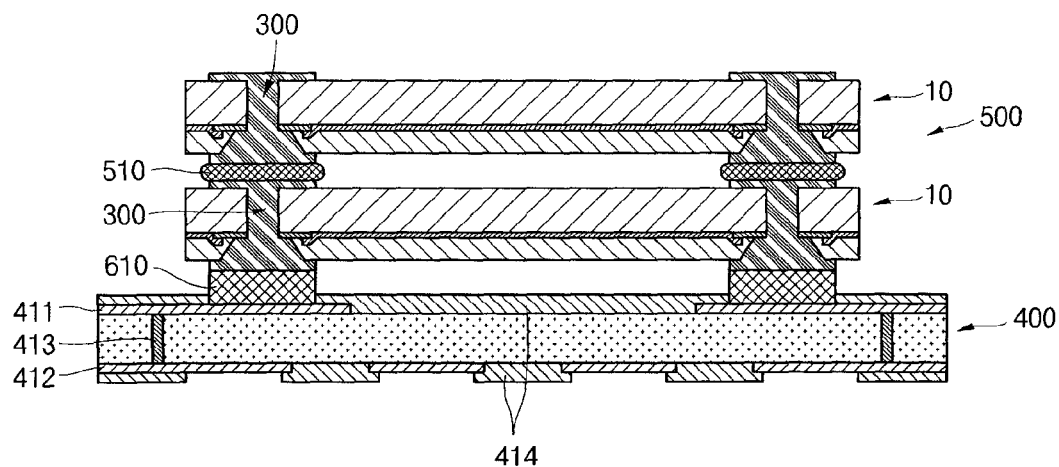

Referring to FIG. 17B, the connecting circuit board with stacked semiconductor package operation (S12) includes preparing the stacked semiconductor package 500 and then coupling the package 500 to the circuit board 400.

The stacked semiconductor package 500 is formed by stacking a plurality of semiconductor packages 10 and by coupling the semiconductor packages 10 electrically by means of the first conductive bump 510. Specifically, the stacked semiconductor package 500 is formed by enabling one semiconductor package 10 and the other semiconductor package 10, arranged in side by side to be electrically coupled to each other through the first conductive bump 510 formed between through silicon via 300 of one and the other semiconductor packages 10. The semiconductor package 10 constituted in the stacked semiconductor package 500 is explained in detail in one embodiment of the present invention and thus the explanation will be omitted. Meanwhile, FIG. 17B shows the stacked semiconductor package 500 is formed by stacking two semiconductor packages 10, however, the stacked semiconductor package 500 may be formed by stacking at least three semiconductor packages 10. Accordingly, the number of the semiconductor packages 10 is not limited thereto, which are stacked in the embodiment of the present invention.

The connecting circuit board with stacked semiconductor package operation (S12) includes stacking the above-constructed stacked semiconductor package 500 on the circuit board 400, and electrically coupling the stacked semiconductor package 500 to the circuit board 400 by connecting the second conductive bump 610 between the through silicon via 300 of one semiconductor package 10 faced to the circuit board 400 of the stacked semiconductor package 500 and the first circuit pattern 411 of the circuit board 400.

Figure 17C:
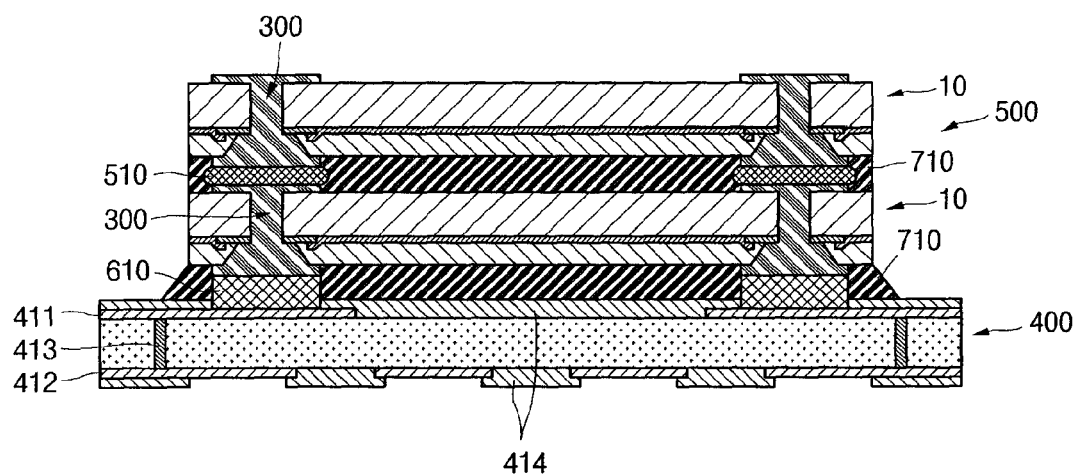

Referring to FIG. 17C, the dispensing underfill operation (S13) includes dispensing the underfill 710 to spaces positioned between a plurality of semiconductor packages 10 of the stacked semiconductor package 500 and between the stacked semiconductor package 500 and the circuit board 400.

Specifically, the dispensing underfill operation (S13) includes dispensing the underfill 710 to surround the first conductive bump 510 positioned between the semiconductor packages 10 using a dispenser (not shown) and to surround the second conductive bump 610 positioned between one semiconductor package 10 faced to the circuit board 400 of the semiconductor packages 10 and the circuit board 400. The underfill 710 maintains stable connection between the first conductive bump 510 and one semiconductor package 10 and between the first conductive bump 510 and the other semiconductor package 10 thermally or mechanically. Additionally, the underfill 710 maintains stable connection between the second conductive bump 610 and one semiconductor package and between the second conductive bump 610 and the circuit board 400 thermally or mechanically.

Figure 17D:
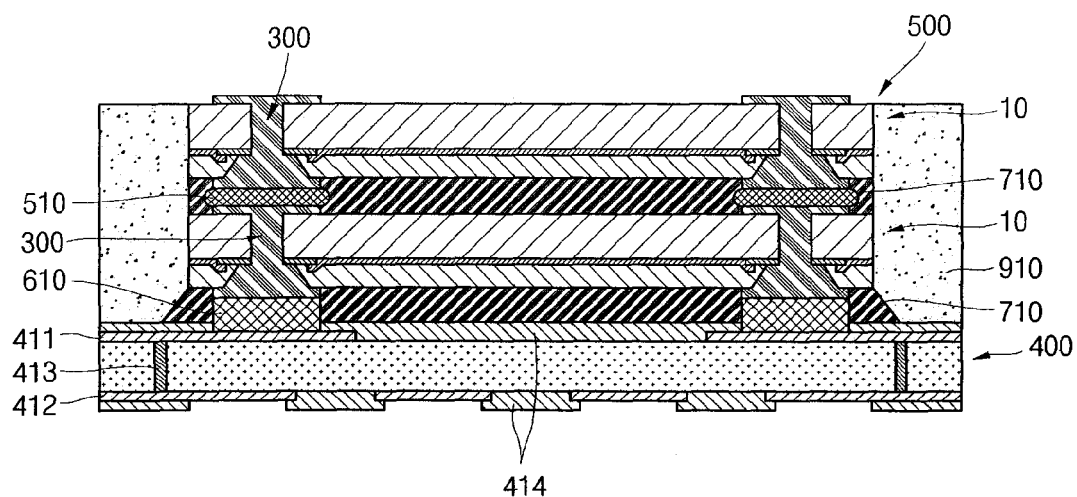

Referring to FIG. 17D, the performing encapsulation operation (S14) includes forming the encapsulant 910 by performing encapsulation to surround the stacked semiconductor package 500 on the circuit board 400.

Specifically, the performing encapsulation operation (S14) includes forming the encapsulant 910 by performing encapsulation to surround the stacked semiconductor package 500 on the circuit board 400, and to expose one surface of the other semiconductor package 10 being outermost from the circuit board 400 in a vertical direction. The encapsulant 910 protects one semiconductor package 10 and the other semiconductor package 10 from the outside and increases bonding force between the circuit board 400 and the stack semiconductor package 500. Additionally, the encapsulant 910 exposes one surface of the other semiconductor package 10. As a result thereof, thermal performance can be increased of the stacked semiconductor package 500 electrically coupled to the circuit board 400.

Figure 17E:
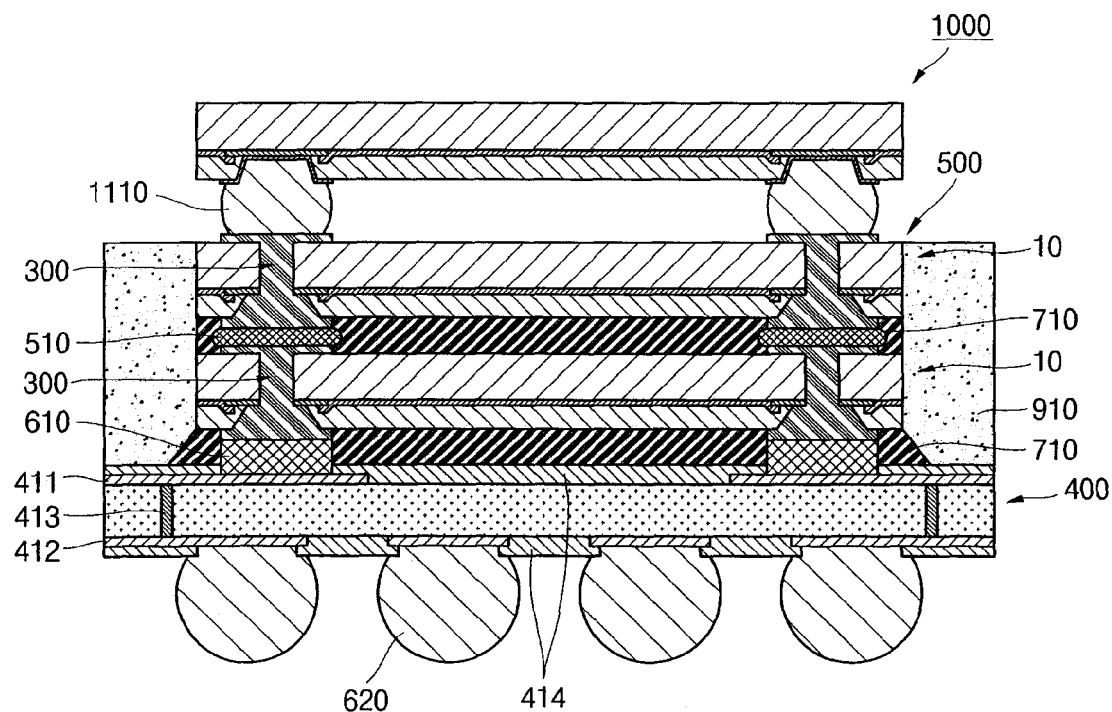

Referring to FIG. 17E, the connecting semiconductor die operation (S15) includes stacking the semiconductor die 1000 on the circuit board 400 and the stacked semiconductor package 500 electrically coupled to each other and electrically coupling the semiconductor die 1000 to the circuit board 400 and the stacked semiconductor package 500 through the third conductive bump 1110.

Specifically, the connecting semiconductor die operation (S15) includes stacking the semiconductor die 1000 on an upper portion of the other semiconductor package 10, sometimes call the outermost semiconductor package, whose one surface is exposed, and electrically coupling the stacked semiconductor package 500 to the semiconductor die 1000 through the third conductive bump 1110 contacted to the through silicon via 300 of the other semiconductor package 10, whose one surface is exposed.

Additionally, the connecting semiconductor die operation (S15) can include bonding the solder ball 620 on the second circuit pattern 412 of the circuit board 400 to connect the semiconductor die 1000, the stacked semiconductor package 500 and the circuit board 400, stacked and electrically coupled to each other, to external devices.

The semiconductor package 1100 fabricated by the above-described method is formed by stacking not only the circuit board 400 and the stacked semiconductor package 500, stacked to each other, but also the semiconductor die 1000. As a result thereof, capacity and functionality of the semiconductor package can be increased.

This disclosure provides embodiments of the present invention. The scope of the present invention is not limited by these embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor package, comprising:
    a semiconductor die comprising:
        a first surface;
        a second surface opposite to the first surface;
        a plurality of bond pads on the first surface; and
        a passivation layer exposing the bond pads;
    first through holes perpendicularly penetrating the bond pads and the first surface;
    second through holes perpendicularly penetrating the passivation layer and the first surface between adjacent bond pads of the bond pads;
    a photosensitive layer pattern formed on the passivation layer and in the second through holes, and having pattern holes exposing the first through holes and portions of the bond pads connected with the first through holes; and
    electrically conductive vias extended inside the first through holes from the photosensitive layer pattern via the pattern holes.

2. The semiconductor package of claim 1, wherein the bond pads are arranged along a periphery of the first surface of the semiconductor die.

3. The semiconductor package of claim 1, wherein the first and second through holes are formed by sawing the semiconductor die along sawing lines passing through the bond pads in a direction from the first surface to the second surface, the second through holes being positioned between the adjacent first through holes.

4. The semiconductor package of claim 1, wherein the photosensitive layer pattern formed in the second through holes electrically insulates the electrically conductive vias from one another.

5. The semiconductor package of claim 1, wherein the electrically conductive vias comprise:
   first electrodes formed on the photosensitive layer pattern;
   second electrodes electrically coupled to the first electrodes and formed in the pattern holes; and
   third electrodes electrically coupled to the second electrodes and formed in the first through holes.

6. The semiconductor package of claim 5, wherein the second electrodes are electrically coupled to the bond pads.

7. The semiconductor package of claim 5, wherein the first electrodes, the second electrodes and the third electrodes are integrally formed.

8. The semiconductor package of claim 5, wherein the third electrodes are rectangular.

9. The semiconductor package of claim 5, wherein the electrically conductive vias further comprise fourth electrodes formed on the second surface of the semiconductor die and electrically coupled to the third electrodes.

10. A semiconductor package, comprising:
   a semiconductor die comprising:
      a first surface;
      a second surface opposite to the first surface;
      a plurality of bond pads on the first surface; and
      a passivation layer exposing the bond pads;
   trenches formed in the first surface of the semiconductor die, the trenches comprising:
      first trench portions perpendicularly penetrating the bond pads and the first surface;
      second trench portions perpendicularly penetrating the passivation layer and the first surface between adjacent bond pads of the bond pads;
   a photosensitive layer pattern formed on the passivation layer and in the second trench portions, and having pattern holes exposing the first trench portions and portions of the bond pads connected with the first trench portions; and
   electrically conductive vias extended inside the first trench portions from the photosensitive layer pattern via the pattern holes.

11. The semiconductor package of claim 10, wherein the trenches are formed by sawing the semiconductor die along sawing lines passing through the bond pads in a direction from the first surface to the second surface.

12. The semiconductor package of claim 10, wherein the second trench portions are positioned between the adjacent first trench portions.

13. A semiconductor package, comprising:
   a semiconductor die comprising:
      a first surface;
      a second surface opposite to the first surface;
      a plurality of bond pads on the first surface; and
      a passivation layer exposing the bond pads;
   first trench portions perpendicularly penetrating the bond pads and the first surface;
   second trench portions perpendicularly penetrating the passivation layer and the first surface between adjacent bond pads of the bond pads;
   a photosensitive layer pattern formed on the passivation layer and in the second trench portions, and having pattern holes exposing the first trench portions and portions of the bond pads connected with the first trench portions; and
   electrically conductive vias extended inside the first trench portions from the photosensitive layer pattern via the pattern holes.

14. The semiconductor package of claim 13, wherein the bond pads are arranged along a periphery of the first surface of the semiconductor die.

15. The semiconductor package of claim 13, wherein the first and second trench portions are formed by sawing the semiconductor die along sawing lines passing through the bond pads in a direction from the first surface to the second surface, the second trench portions being positioned between the adjacent first trench portions.

16. The semiconductor package of claim 13, wherein the photosensitive layer pattern formed in the second trench portions electrically insulates the electrically conductive vias from one another.

17. The semiconductor package of claim 13, wherein the electrically conductive vias comprise:
   first electrodes formed on the photosensitive layer pattern;
   second electrodes electrically coupled to the first electrodes and formed in the pattern holes; and
   third electrodes electrically coupled to the second electrodes and formed in the first trench portions.

18. The semiconductor package of claim 17, wherein the second electrodes are electrically coupled to the bond pads.

19. The semiconductor package of claim 17, wherein the first electrodes, the second electrodes and the third electrodes are integrally formed.

20. The semiconductor package of claim 17, wherein the third electrodes are rectangular.

* * * * *